(12) United States Patent
Maruyama et al.

(10) Patent No.: US 11,626,358 B2
(45) Date of Patent: Apr. 11, 2023

(54) SEMICONDUCTOR DEVICE

(71) Applicant: FUJI ELECTRIC CO., LTD., Kawasaki (JP)

(72) Inventors: Rikihiro Maruyama, Matsumoto (JP); Seiichi Takahashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/213,957

(22) Filed: Mar. 26, 2021

(65) Prior Publication Data

US 2021/0375734 A1    Dec. 2, 2021

(30) Foreign Application Priority Data

May 27, 2020 (JP) .............................. JP2020-092407

(51) Int. Cl.
*H01L 23/498* (2006.01)
*H01L 23/00* (2006.01)

(52) U.S. Cl.
CPC ........ *H01L 23/49811* (2013.01); *H01L 24/48* (2013.01); *H01L 24/49* (2013.01); *H01L 2224/48137* (2013.01); *H01L 2224/48155* (2013.01); *H01L 2224/49177* (2013.01)

(58) Field of Classification Search
CPC ............................ H01L 23/49811; H01L 23/48
See application file for complete search history.

(56) References Cited

U.S. PATENT DOCUMENTS

| 2009/0194884 | A1 | 8/2009 | Stolze | |
|---|---|---|---|---|
| 2011/0121450 | A1* | 5/2011 | Tsukada | ................. H01L 24/01 |
| | | | | 257/737 |
| 2012/0127681 | A1* | 5/2012 | Ryu | ..................... H05K 3/3447 |
| | | | | 174/126.1 |
| 2012/0320545 | A1* | 12/2012 | Lo Presti | ............. H05K 7/1432 |
| | | | | 361/752 |
| 2014/0246783 | A1 | 9/2014 | Nishizawa et al. | |
| 2016/0343647 | A1* | 11/2016 | Kai | ......................... H01L 24/80 |
| 2020/0152592 | A1* | 5/2020 | Ho | ...................... H01L 23/5385 |

FOREIGN PATENT DOCUMENTS

| JP | 2013-125803 A | 6/2013 |
|---|---|---|
| JP | 2014-123618 A | 7/2014 |
| JP | 2016-219554 A | 12/2016 |

* cited by examiner

*Primary Examiner* — Michele Fan
(74) *Attorney, Agent, or Firm* — Rabin & Berdo, P.C.

(57) ABSTRACT

A semiconductor device, including a circuit pattern, a contact part and an external connection terminal. The contact part has a cylindrical through-hole and first and second opening ends opposite to each other, the second opening end being joined to the circuit pattern. The external connection terminal has a prismatic main body portion and first and second end portions, the second end portion being inserted into the through-hole from the first opening end of the contact part. The main body portion of the external connection terminal has an insertion prevented portion formed thereon. The contact part includes an insertion preventing portion formed on an inner circumferential surface of the through-hole, the insertion preventing portion being so positioned as to be substantially downstream, with respect to an insertion direction of the external connection terminal, from the main body portion of the external connection terminal inserted into the through-hole.

20 Claims, 21 Drawing Sheets

$B1 > B2 \geq B3$

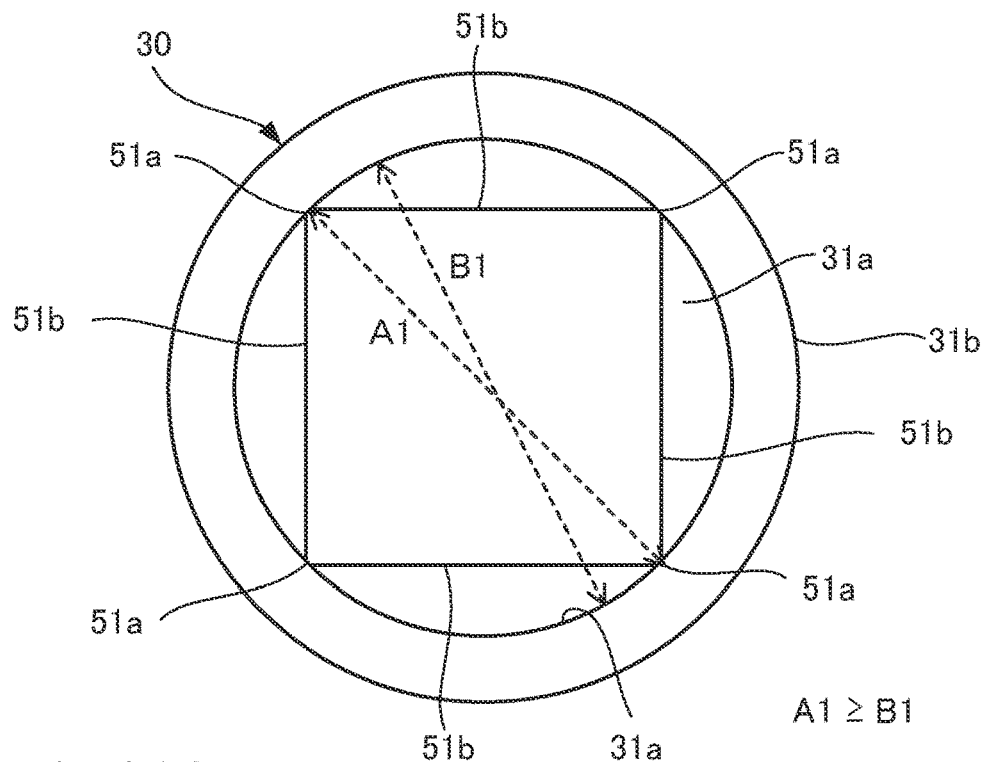
FIG. 21A     $A1 \geq B1$
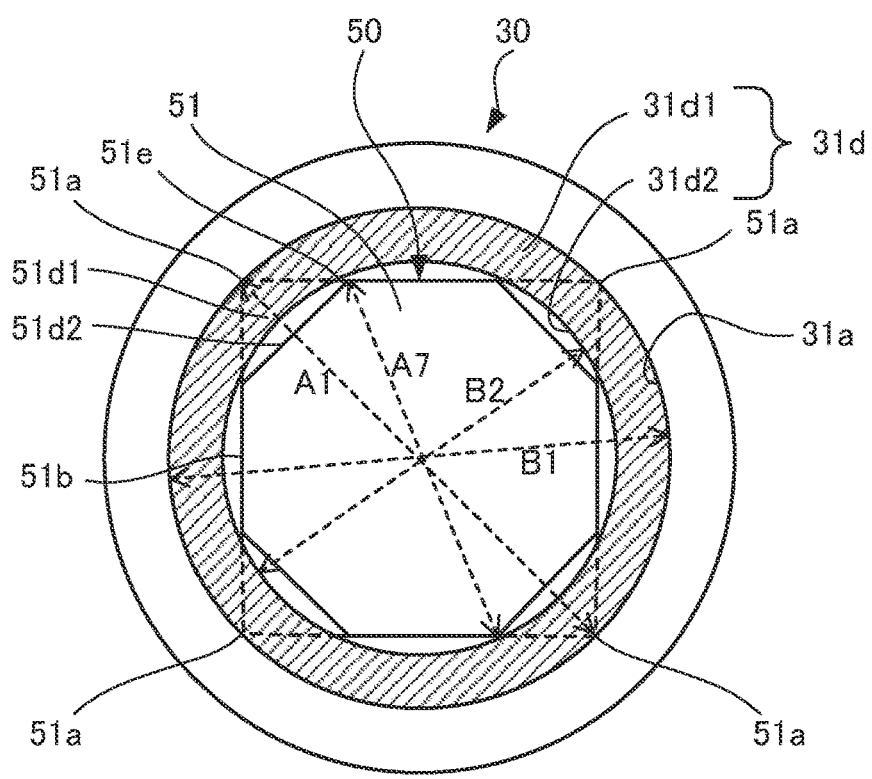
FIG. 21B     $A1 \geq B1 > B2 \geq A7$

SEMICONDUCTOR DEVICE

CROSS-REFERENCE TO RELATED APPLICATIONS

This application is based upon and claims the benefit of priority of the prior Japanese Patent Application No. 2020-092407, filed on May 27, 2020, the entire contents of which are incorporated herein by reference.

BACKGROUND OF THE INVENTION

1. Field of the Invention

The embodiments discussed herein relate to a semiconductor device.

2. Background of the Related Art

A semiconductor device includes semiconductor elements such as insulated gate bipolar transistors (IGBTs) and power metal oxide semiconductor field effect transistors (MOSFET). Such a semiconductor device is used as a power conversion device, for example.

A semiconductor device includes a substrate that includes an insulating board and a plurality of circuit patterns formed on the front surface of the insulating board. In addition, semiconductor elements and external connection terminals are disposed on the circuit patterns. A signal applied via an external connection terminal passes through a circuit pattern and enters a semiconductor element.

To attach the external connection terminals to the circuit patterns, cylindrical contact parts are used. The contact parts are soldered to the circuit patterns. The external connection terminals are press-fitted into the contact parts. By doing so, the external connection terminals are electrically connected to the circuit patterns via the contact parts (for example, please see U.S. patent application publication No. 2009/0194884).

To manufacture a semiconductor device, a plurality of heating (or cooling) steps are executed. For example, heating steps are executed to solder semiconductor chips and contact parts to circuit patterns and to attach a case to a substrate by an adhesive. Therefore, the components of the semiconductor device are subject to various temperature changes.

In the semiconductor device having been subject to the temperature changes or others, different indentation loads may be needed to press-fit the external connection terminals into the plurality of contact parts. Even a prescribed device is used to press-fit the external connection terminals into the plurality of contact parts simultaneously, the press-fitted states of the external connection terminals into the contact parts may differ. For example, the inserted depths of the external connection terminals in the contact parts may differ. This causes different heights of the plurality of external connection terminals press-fitted into the plurality of contact parts. The different heights of the plurality of external connection terminals prevent appropriate attachment of a printed circuit board to the plurality of external connection terminals.

SUMMARY OF THE INVENTION

According to one aspect, there is provided a semiconductor device including a circuit pattern; a contact part having a cylindrical through-hole formed therein, and having first and second opening ends opposite to each other, the second opening end being joined to the circuit pattern; and an external connection terminal having a prismatic main body portion, and first and second end portions, the second end portion being inserted into the through-hole from the first opening end of the contact part, wherein the main body portion of the external connection terminal has an insertion prevented portion formed thereon, and the contact part includes an insertion preventing portion formed on an inner circumferential surface of the through-hole, the insertion preventing portion being so positioned as to be substantially downstream, with respect to an insertion direction, from the main body portion of the external connection terminal inserted into the through-hole, the insertion direction being a direction from the first end portion to the second end portion of the external connection terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 21A and 21B are plane sectional views after the insertion of the external connection terminal into the contact part provided in the semiconductor device according to the third embodiment.

DETAILED DESCRIPTION OF THE INVENTION

Hereinafter, some embodiments will be described with reference to the accompanying drawings. In the following description, the terms "front surface" and "upper surface" represent surfaces facing up in a semiconductor device 1 illustrated in FIG. 1. Similarly, the term represents an upward direction in the semiconductor device 1 of FIG. 1. The terms "rear surface" and "lower surface" represent surfaces facing down in the semiconductor device 1 of FIG. 1. The term "down" represents a downward direction in the semiconductor device 1 of FIG. 1. The same directionality applies to the other drawings, as appropriate. The terms "front surface," "upper surface," "up," "rear surface," "lower surface," "down," and "side surface" are used for convenience to describe relative positional relationships, and do not limit the technical ideas of the embodiments. For example, the terms "up" and "down" do not always represent the vertical direction to the ground. That is, the "up" and "down" directions are not limited to the gravity direction. In addition, in the following description, a component contained by 80 vol % or more is called a "principal component."

First Embodiment

Figure 1:
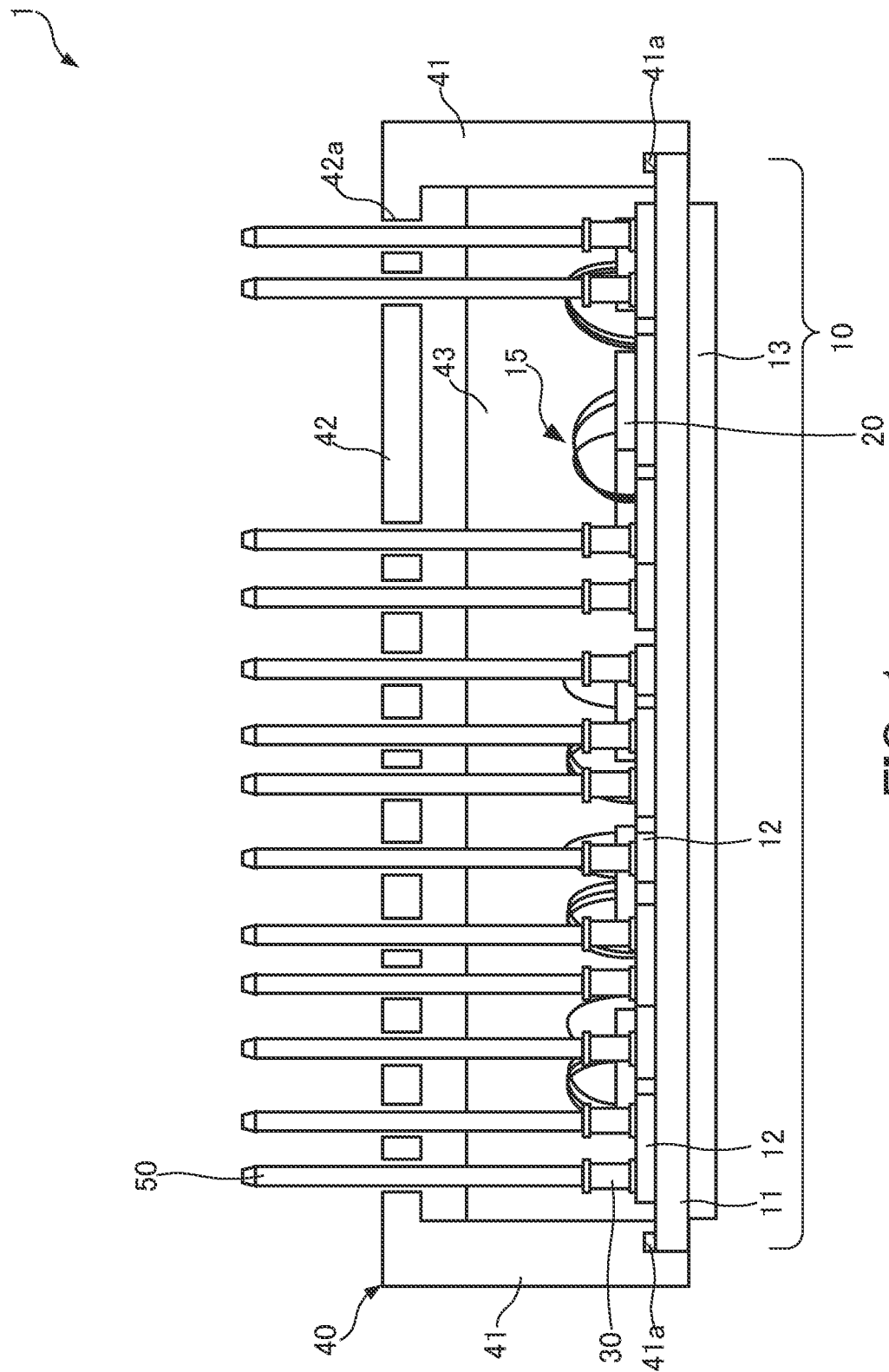
FIG. 1 is a sectional view of a semiconductor device according to a first embodiment.
Figure 2:
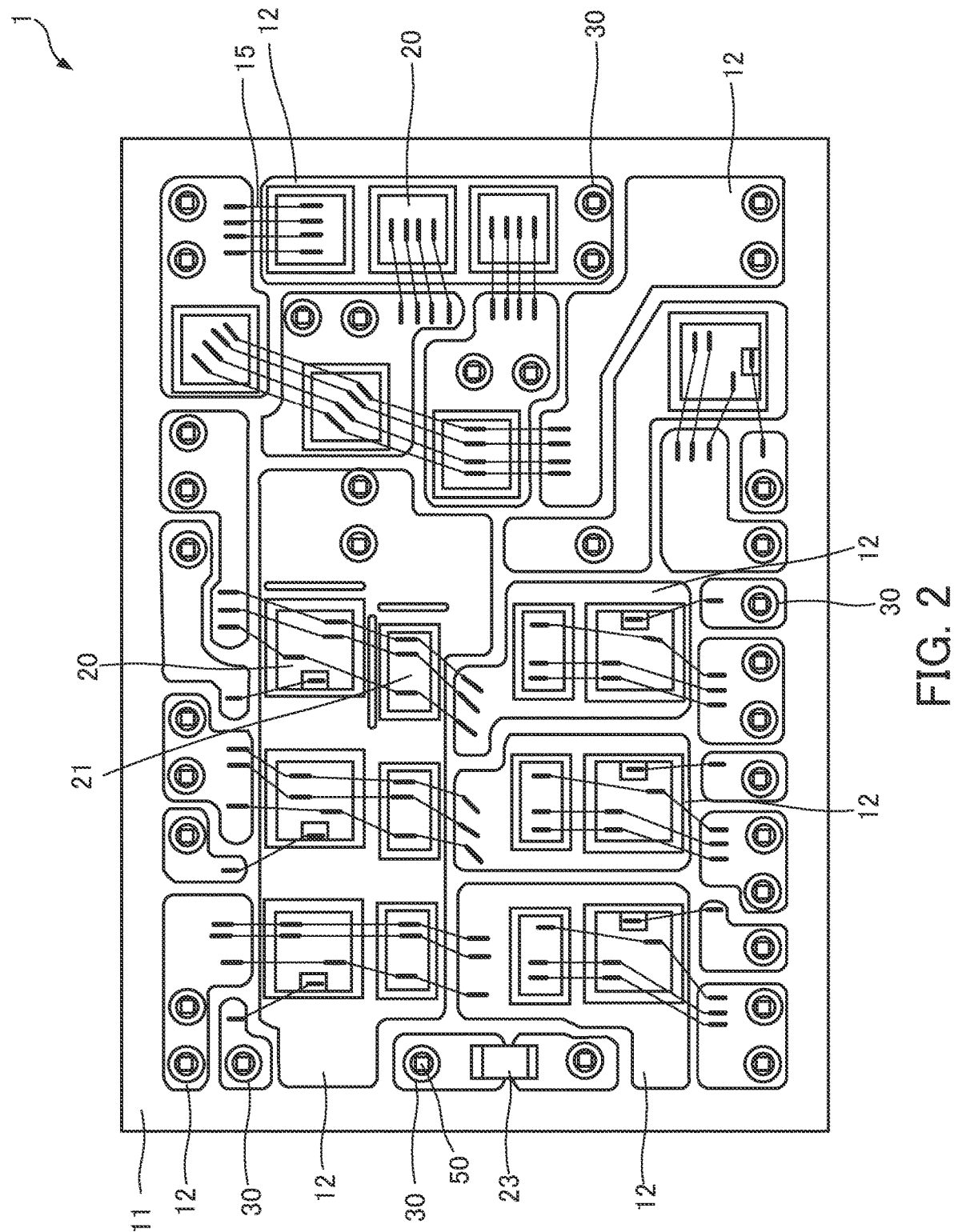
FIG. 2 is a plan view of an insulated circuit board provided in the semiconductor device according to the first embodiment.

A semiconductor device 1 of a first embodiment will be described with reference to FIGS. 1 and 2. FIG. 1 is a sectional view of the semiconductor device according to the first embodiment, and FIG. 2 is a plan view of an insulated circuit board provided in the semiconductor device according to the first embodiment. In this connection, in the plan view of FIG. 2, a case 40 has been removed from the semiconductor device 1 of FIG. 1. In addition, in the following description, components that are each provided in plurality will be expressed in the singular form without being distinguished from each other and without using different reference numerals, unless otherwise expressly stated. This means that terms in the singular form shall be construed to include the plural. Such components include a plurality of circuit patterns 12, a plurality of first semiconductor chips 20, a plurality of second semiconductor chips 21, a plurality of contact parts 30, a plurality of bonding wires 15, and a plurality of external connection terminals 50.

As illustrated in FIGS. 1 and 2, the semiconductor device 1 includes an insulated circuit board 10, and first and second semiconductor chips 20 and 21 and an electronic part 23 joined to the front surface of the insulated circuit board 10. The semiconductor device 1 also includes a contact part 30 joined to the front surface of the insulated circuit board 10. The first and second semiconductor chips 20 and 21, electronic part 23, and contact part 30 are joined to the front surface of the insulated circuit board 10 via a joining member (not illustrated). In addition, the semiconductor device 1 includes a bonding wire 15 that electrically connects the front surface of the insulated circuit board 10 and the main electrodes of the first and second semiconductor chips 20 and 21. The external connection terminal 50 is press-fitted into the contact part 30. In the semiconductor device 1, these components are covered by the case 40. The case 40 is joined to the outer periphery of an insulating board 11 of the insulated circuit board 10 via an adhesive 41a. In this connection, an end portion of the external connection terminal 50 extends upward from the case 40. In addition, in the semiconductor device 1, the inside of the case 40 is filled with a sealing member 43.

The insulated circuit board 10 includes the insulating board 11, the plurality of circuit patterns 12 formed on the front surface of the insulating board 11, and a metal plate 13 disposed on the rear surface of the insulating board 11. The insulating board 11 and metal plate 13 are rectangular in plan view. In addition, the corners of the insulating board 11 and metal plate 13 may be rounded or chamfered. In plan view, the metal plate 13 is smaller in size than the insulating board 11 and is disposed inside the insulating board 11. The insulating board 11 has an insulating property and is made of a material with high thermal conductivity. The insulating board 11 is made of ceramics or insulating resin.

The plurality of circuit patterns 12 are made of metal with high conductivity. Examples of the metal include copper, aluminum, and an alloy mainly containing at least one of these as a principal component. In addition, the thickness of each circuit pattern 12 is in a range from 0.5 mm to 2.0 mm, inclusive. To improve the corrosion resistance, plating may be performed on the surfaces of the plurality of circuit patterns 12. Examples of the plating material include nickel, a nickel-phosphorus alloy, and a nickel-boron alloy. The plurality of circuit patterns 12 are formed on the insulating board by forming a metal layer on the front surface of the insulating board 11 and performing etching or another on the metal layer. Alternatively, the plurality of circuit patterns 12 cut out from a metal layer in advance may be press-bonded to the front surface of the insulating board 11. In this connection, the plurality of circuit patterns 12 illustrated in FIG. 2 are just an example, and the number of circuit patterns 12 and the shapes and sizes thereof may be determined as appropriate.

The contact parts 30 are mostly soldered to outer circuit patterns 12, which are located at the outer periphery part of the insulating board 11, out of the plurality of circuit patterns 12. The first and second semiconductor chips 20 and 21 are mostly soldered to inner circuit patterns 12, which are located inside the outer circuit patterns 12, out of the plurality of circuit patterns 12.

The metal plate 13 is made of metal with high thermal conductivity. Examples of the metal include copper, aluminum, and an alloy mainly containing at least one of these as a principal component. The thickness of the metal plate 13 is in a range from 0.1 mm to 2.5 mm, inclusive. To improve the corrosion resistance, plating may be performed on the surface of the metal plate 13. Examples of the plating material include nickel, a nickel-phosphorus alloy, and a nickel-boron alloy. In this connection, the insulating board 11 and metal plate 13 are rectangular in plan view. In addition, in plan view, the metal plate 13 is smaller in size than the insulating board 11, is larger in area than a region where the circuit patterns 12 are formed, and is rectangular.

The bonding wire 15 electrically connects a first or second semiconductor chip 20 or 21 and the circuit pattern 12, or the first and second semiconductor chips 20 and 21 as appropriate. The bonding wire 15 is made of a material with high conductivity. Examples of the material include gold, silver, copper, aluminum, and an alloy containing at least one of these. The diameter of the bonding wire is in a range from 110 μm to 200 μm, inclusive. Alternatively, the diameter of the bonding wire 15 may be in a range from 350 μm to 500 μm, inclusive.

As the insulated circuit board 10 having the above configuration, a direct copper bonding (DCB) substrate, an active metal brazed (AMB) substrate, or a resin insulating substrate may be used. In addition, a cooling unit (not illustrated) may be attached to the metal plate 13 of the insulated circuit board 10 via a thermal interface material. This configuration makes it possible to improve the heat dissipation property of the semiconductor device 1.

The first semiconductor chip 20 includes a power device element made of silicon or silicon carbide. The power device element is a switching element, such as an IGBT or power MOSFET, for example. Such a first semiconductor chip 20, for example, has a drain electrode (or collector electrode) serving as a main electrode on its rear surface, and a gate electrode and a source electrode (or emitter electrode) serving as a main electrode on its front surface. The second semiconductor chip 21 is a diode element made of silicon or silicon carbide. The diode element is a free wheeling diode (FWD), such as a Shottky barrier diode (SBD) or P-intrinsic-N (PiN) diode, for example. Such a second semiconductor chip 21 has a cathode electrode serving as a main electrode on its rear surface and an anode electrode serving as a main electrode on its front surface. The first and second semiconductor chips 20 and 21 are joined to prescribed circuit patterns 12 via a joining member (not illustrated), with their rear surfaces facing the circuit patterns 12. In this connection, the joining material is solder or sintered metal. In addition, for example, a lead frame, external connection terminals (pin terminals, contact parts, and others), electronic parts (thermistors, current sensors), and others may be disposed, in place of the first and second semiconductor chips 20 and 21, according to necessity. The electronic part 23 includes capacitors, resistors, thermistors, current sensors, control integrated circuit (IC), and others. One electronic part 23 or a plurality of electronic parts 23 may be disposed on the circuit patterns 12 so that the semiconductor device 1 has desired functions. To achieve the functions, different kinds of electronic parts 23 may be used.

The contact part 30 has a body portion having a cylindrical through-hole formed therein and flanges provided at the opening ends of the body portion. The contact part 30 is made of metal with high conductivity. Examples of the metal include silver, copper, nickel, and an alloy containing at least one of these. To improve the corrosion resistance, plating may be performed to form a plating film on the surface of the contact part 30. Examples of the plating material for the plating film include nickel, a nickel-phosphorus alloy, and a nickel-boron alloy. In the contact part 30, each radius at the opening ends of the through-hole is in a range from 0.1 mm to 1.0 mm, inclusive. In addition, the radius of each outer diameter of the flanges at the opening ends is in a range from 0.5 mm to 2.0 mm, inclusive. The contact part 30 will be described in detail later.

The external connection terminal 50 has a prismatic main body portion and frustoconical end portions at both ends of the main body portion. The external connection terminal 50 is inserted into the through-hole of the contact part 30. The external connection terminal 50 is made of metal with high conductivity. Examples of the metal include copper, aluminum, nickel, and an alloy containing at least one of these. To improve the corrosion resistance, plating may be performed to form a plating film on the surface of the external connection terminal 50. Examples of the plating material for the plating film include nickel, a nickel-phosphorus alloy, and a nickel-boron alloy. The external connection terminal 50 will be described in detail later.

The case 40 has an outer surrounding portion 41 and a top lid 42. The outer surrounding portion 41 surrounds the above-described insulated circuit board 10. The outer surrounding portion 41 is box-shaped and is approximately rectangular in plan view. The outer surrounding portion 41 has a fixed hole (not illustrated) at each of the four corners thereof in plan view. The fixed holes pierce from the front surface to the rear surface of the outer surrounding portion 41. The top lid 42 covers the top of the opening of the outer surrounding portion 41 and is integrally attached to the outer surrounding portion 41. In addition, in the top lid 42, an insertion hole 42a is formed at a position corresponding to the external connection terminal 50. The case 40 is made of thermoplastic resin. Examples of the resin include polybutylene sulfide resin, polybutylene terephthalate resin, polybutylene succinate resin, polyimide resin, and acrylonitrile butadiene styrene resin.

The sealing member 43 may be silicone gel, for example. The sealing member 43 contains a thermosetting resin and a filler, which is contained in the thermosetting resin. Examples of the thermosetting resin include epoxy resin, phenolic resin, and melamine resin. In addition, examples of the filler include silicon oxide, aluminum oxide, boron nitride, and aluminum nitride. As an example, the sealing member 43 is made of epoxy resin and, as a filler, silicon oxide, aluminum oxide, boron nitride, aluminum nitride, or another.

A printed circuit board (not illustrated) may be attached to the semiconductor device 1 configured with the above-described components. The printed circuit board includes an insulating board and a plurality of circuit patterns formed on at least one of the front and rear surfaces of the insulating board. In the printed circuit board, a plurality of through-holes piercing from the front surface to the rear surface are formed at positions corresponding to the external connection terminals 50 of the semiconductor device 1. The insulating board is planar and is made of an insulating material. Specific examples of the insulating board include a paper phenolic board, a paper epoxy board, a glass epoxy board, a glass polyimide substrate, and a glass composite substrate. Such an insulating board is rectangular in plan view. The corners of the insulating board may be rounded or chamfered. The circuit patterns include a plurality of patterns so as to allow prescribed circuits to be configured thereon. The circuit patterns are made of a material with high conductivity. Examples of the material include copper, aluminum, nickel, and an alloy containing at least one of these. To improve the corrosion resistance, plating may be performed on the surfaces of the upper circuit patterns and lower circuit patterns. Examples of the plating material include nickel, a nickel-phosphorus alloy, and a nickel-boron alloy. In addition, the through-holes are electrically connected to the upper circuit patterns, the lower circuit patterns, or all of them as appropriate. In the semiconductor device 1, the external connection terminals 50 are inserted into the through-holes of the printed circuit board for electrical connection. Thus, the printed circuit board and the semiconductor device 1 are electrically connected to each other.

Figure 3A:
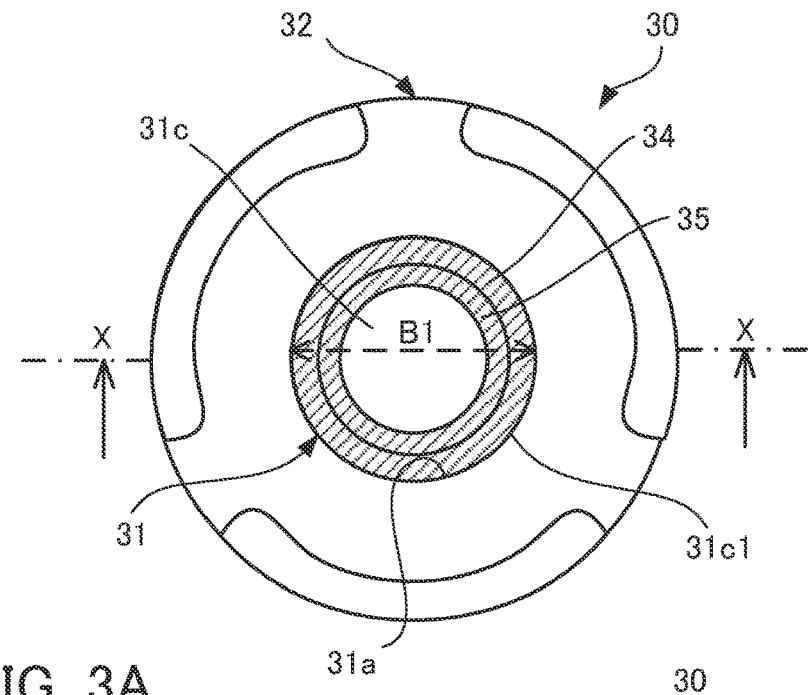
FIGS. 3A and 3B are views for explaining a contact part provided in the semiconductor device according to the first embodiment.
Figure 3B:
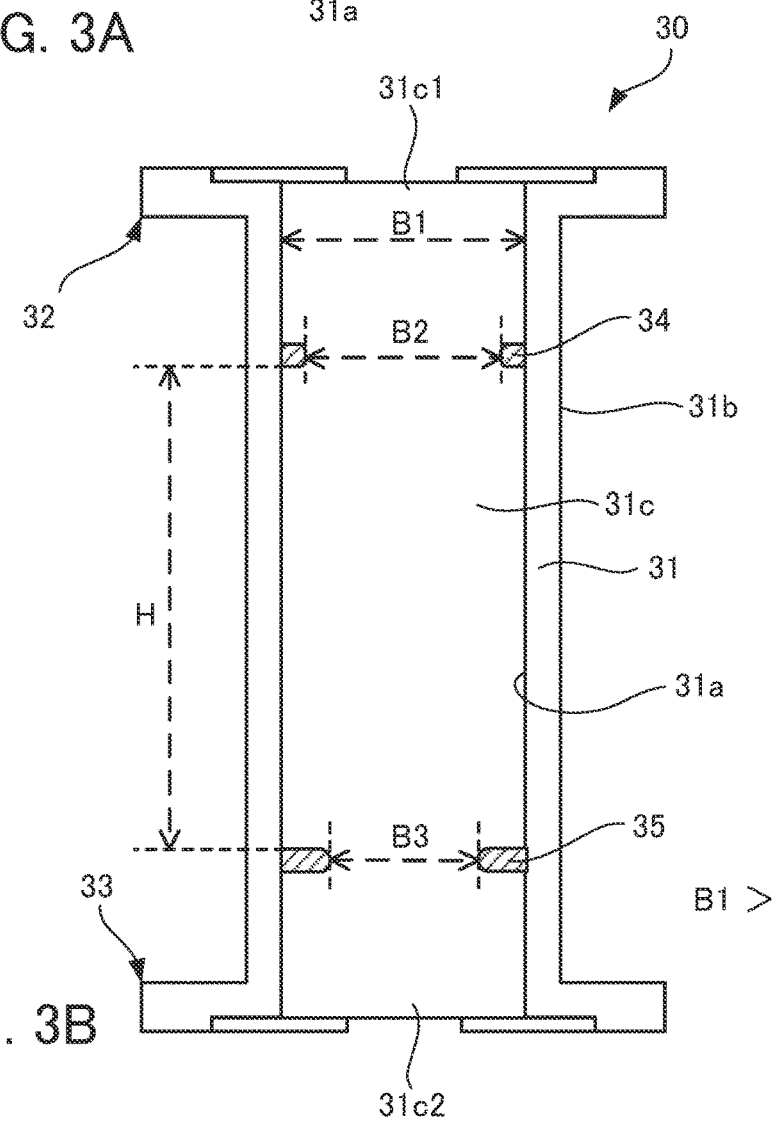

The following describes the contact part provided in the semiconductor device 1 with reference to FIGS. 3A and 3B. FIGS. 3A and 3B are views for explaining the contact part provided in the semiconductor device according to the first embodiment. In this connection, FIG. 3A is a plan view at an opening end 31c1 of FIG. 3B. FIG. 3B is a sectional view taken along the dot-dashed line X-X of FIG. 3A.

The contact part 30 has a body portion 31 and flanges 32 and 33 respectively provided at the opening ends 31c1 (i.e., the first opening end) and 31c2 (i.e., the second opening end) of the body portion 31. The body portion 31 has a cylindrical through-hole 31c formed therein, an inner circumferential surface 31a, and an outer circumferential surface 31b. The body portion 31 has an extraction preventing portion 34 formed on the side closer to the opening end 31c1 on the inner circumferential surface 31a of the through-hole 31c, and an insertion preventing portion 35 formed on the side closer to the opening end 31c2 on the inner circumferential surface 31a. The extraction preventing portion 34 and insertion preventing portion are each formed in a ring on the inner circumferential surface 31a and protrude toward the center of the through-hole 31c. The extraction preventing portion 34 and insertion preventing portion 35 are not limited to have a ring shape on the inner circumferential surface 31a, but may be formed discontinuously along the inner circumference on the inner circumferential surface 31a as long as they are able to catch the external connection terminal 50. In addition, the extraction preventing portion 34 and insertion preventing portion 35 may be formed by performing deformation processing, grinding operations, lathe operations, cutting operations, or another on the inner circumferential surface 31a of the through-hole 31c. Alternatively, the extraction preventing portion 34 and insertion preventing portion 35 may be joined to the inner circumferential surface 31a of the through-hole 31c by heat, adhesive, and/or welding. Although FIGS. 3A, 3B, and others represent the extraction preventing portion 34 and insertion preventing portion 35 by diagonal lines, unlike the body portion 31, the extraction preventing portion 34 and insertion preventing portion 35 may be formed of the same material as the body portion 31.

In addition, in the body portion 31, the inner diameter B1 of the through-hole 31c is greater than the inner diameter B2 of the extraction preventing portion 34 and the inner diameter B3 of the insertion preventing portion 35, and the inner diameter B2 of the extraction preventing portion 34 is greater than or equal to the inner diameter B3 of the insertion preventing portion 35 (i.e., inner diameter B1>inner diameter B2≥inner diameter B3). Taking the height (length) from the insertion preventing portion 35 to the extraction preventing portion 34 as H, the height H is set so that thick portions 51c (serving as an extraction prevented portion) of the external connection terminal 50 press-inserted into the contact part 30 are contained within the height H, as will be described later. That is, the height H is equal to or a little less than the length from the top of a tapered surface 53a (serving as an insertion prevented portion) of the external connection terminal 50 to the tops of the thick portions 51c (extraction prevented portion). The height H is preferably in a range from 80% to 100%, inclusive, of the length from the top of the tapered surface 53a (insertion prevented portion) of the external connection terminal to the tops of the thick portions 51c (the extraction prevented portion). The flanges 32 and 33 are formed at both the opening ends 31c1 and 31c2 of the through-hole 31c of the body portion 31. The outer diameter of each flange 32 and 33 is greater than that of the body portion 31.

Figure 4:
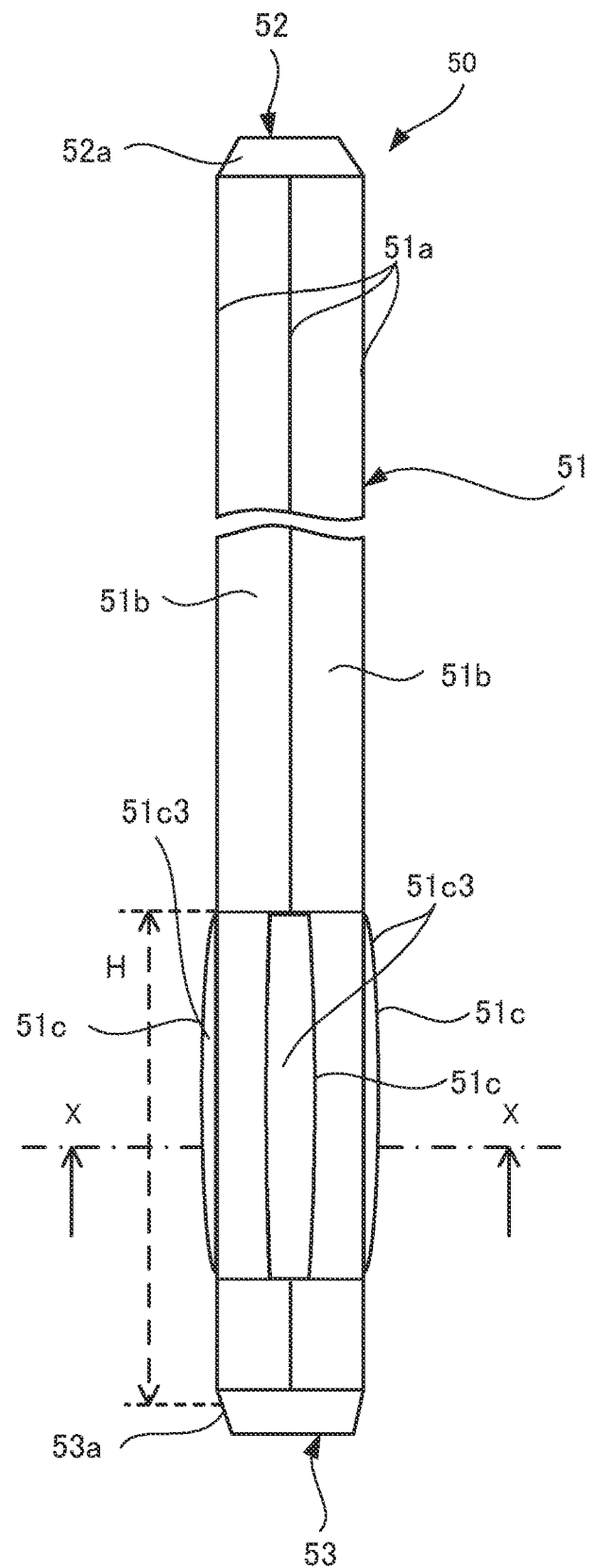
FIG. 4 is a front view of an external connection terminal provided in the semiconductor device according to the first embodiment.
Figure 5A:
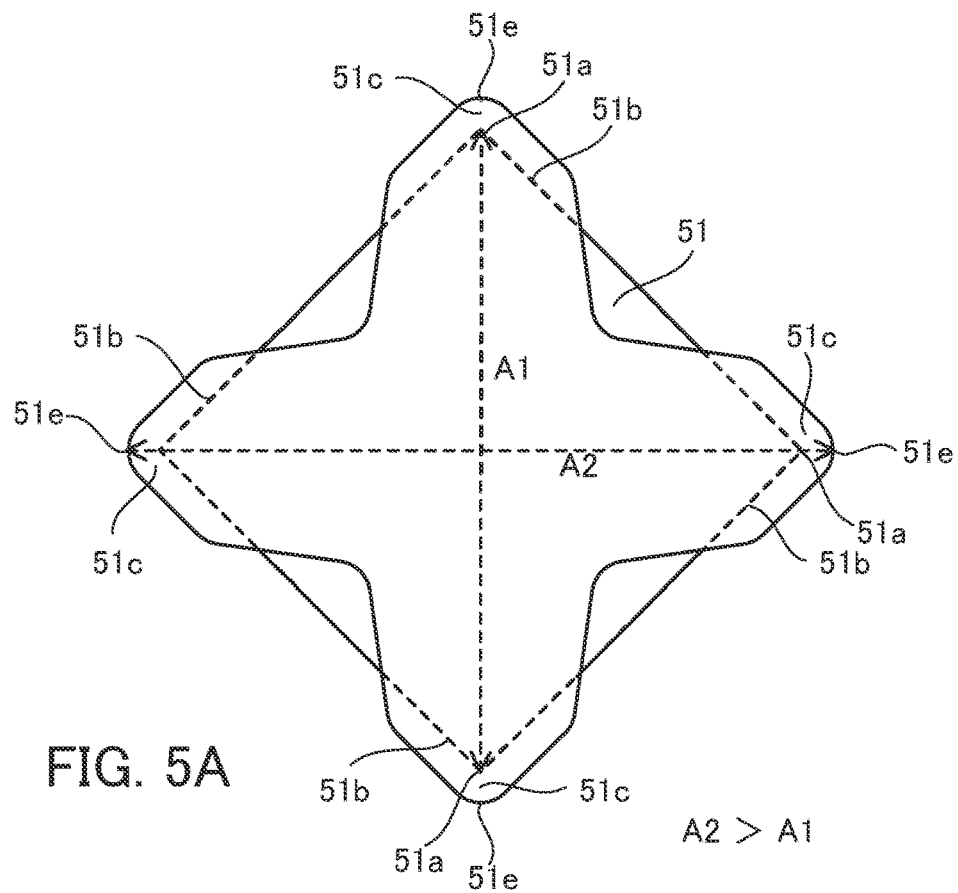
FIGS. 5A and 5B are plane sectional views of the external connection terminal provided in the semiconductor device according to the first embodiment.
Figure 5B:
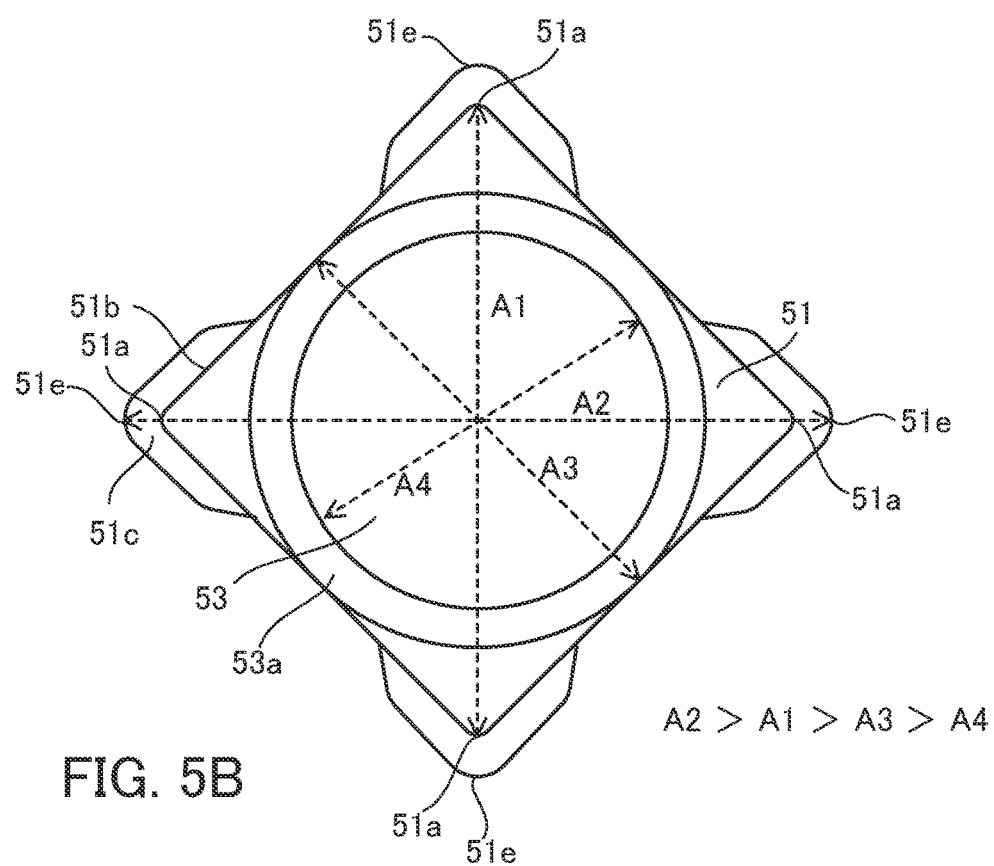

The following describes the external connection terminal 50 provided in the semiconductor device 1 with reference to FIGS. 4, 5A, and 5B. FIG. 4 is a front view of the external connection terminal provided in the semiconductor device according to the first embodiment, and FIGS. 5A and 5B are plane sectional views of the external connection terminal provided in the semiconductor device according to the first embodiment. In this connection, FIG. 5A is a sectional view taken along the dot-dashed line X-X of FIG. 4, and FIG. 5B is a plane view of the external connection terminal 50 (as viewed from above or bottom in FIG. 4).

The external connection terminal 50 has a main body portion 51, and end portions 52 (i.e., the first end portion) and 53 (i.e., the second end portion). The main body portion 51 is prismatic. The main body portion 51 has four surrounding outer surfaces 51b and four edges 51a extending between two mating outer surfaces 51b. The main body portion 51 also has, at each edge 51a, a thick portion 51c that protrudes outward from the edge 51a and that extends from a lower part to a prescribed position of the main body portion 51 as seen in FIG. 4. The thick portions 51c serve as an extraction prevented portion. In addition, the thick portions 51c are formed on the upstream side of the end portion 53 in the insertion direction of the external connection terminal 50 into the contact part 30. In this connection, the insertion direction is directed from the end portion 52 toward the end portion 53.

The thick portions 51c are formed by deformation processing that involves pressing the outer surfaces 51b of the main body portion 51 toward the center of the main body portion 51. Therefore, as illustrated in FIG. 5A, the main body portion 51 of the external connection terminal 50 has a recess at the center of each outer surface 51b and also has, at each edge 51a, the thick portion 51c that protrudes outward from the edge 51a. In addition, the outer surface of each thick portion 51c has an extraction prevented surface 51c3. The extraction prevented surfaces 51c3 have a prescribed length in a direction parallel to the insertion direction. Each extraction prevented surface 51c3 is a curved surface such that the extraction prevented surface 51c3 gets more distant from the main body portion 51 as it gets farther from the end portion 52, is the most distant from the main body portion 51 at the center of the extraction prevented surface 51c3, and gets closer to the main body portion 51 as it gets closer to the end portion 53 beyond the center. The edges 55e of the extraction prevented surfaces 51c3 are rounded as illustrated in FIG. 5B.

The end portions 52 and 53 are located at both ends of the main body portion 51 and each have a frustoconical shape. That is, each end portion 52 and 53 has a tapered surface 52a, 53a (insertion prevented portion). The tapered surface 52a, 53a forms a side surface that reduces in diameter toward the top or bottom of the external connection terminal 50. In addition, the diameter A4 of the tip surface (top surface) A4 of each end portion 52 and 53 is less than the diameter A3 of the bottom surface opposite to the top surface. These end portions 52 and 53 may be joined to both the ends of the main body portion 51 by heat, adhesive, and/or welding. Alternatively, the end portions 52 and 53 may be formed by performing deformation processing, grinding operations, lathe operations, cutting operations, or another on both the ends of the main body portion 51.

In addition, the external connection terminal 50 is configured to satisfy "length A2>length A1>diameter A3>diameter A4," where the length A1 denotes a diagonal length of the main body portion 51 and the length A2 denotes the length between the edges 55e of thick portions 51c opposite to each other with the center of the main body portion 51 therebetween (see FIG. 5B).

Figure 6:
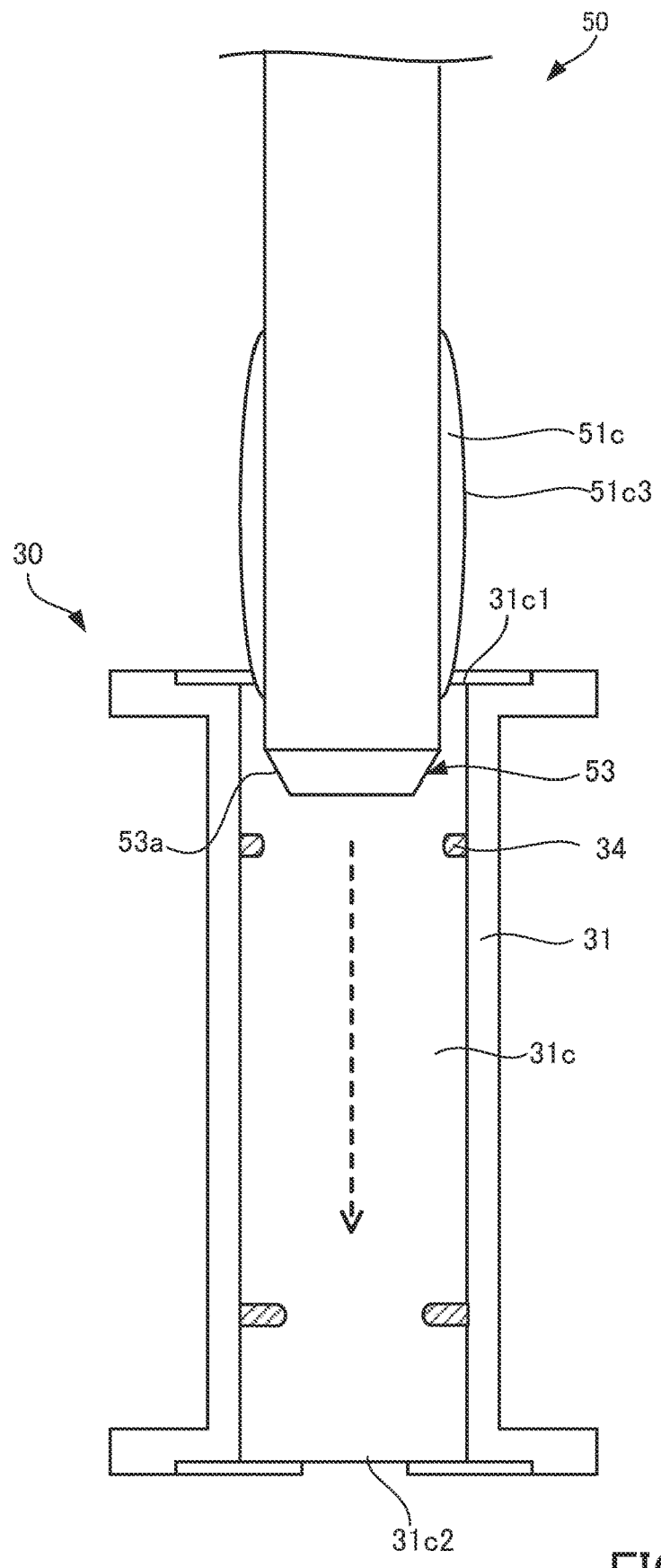
FIG. 6 is a side sectional view before insertion of the external connection terminal into the contact part provided in the semiconductor device according to the first embodiment.
Figure 7:
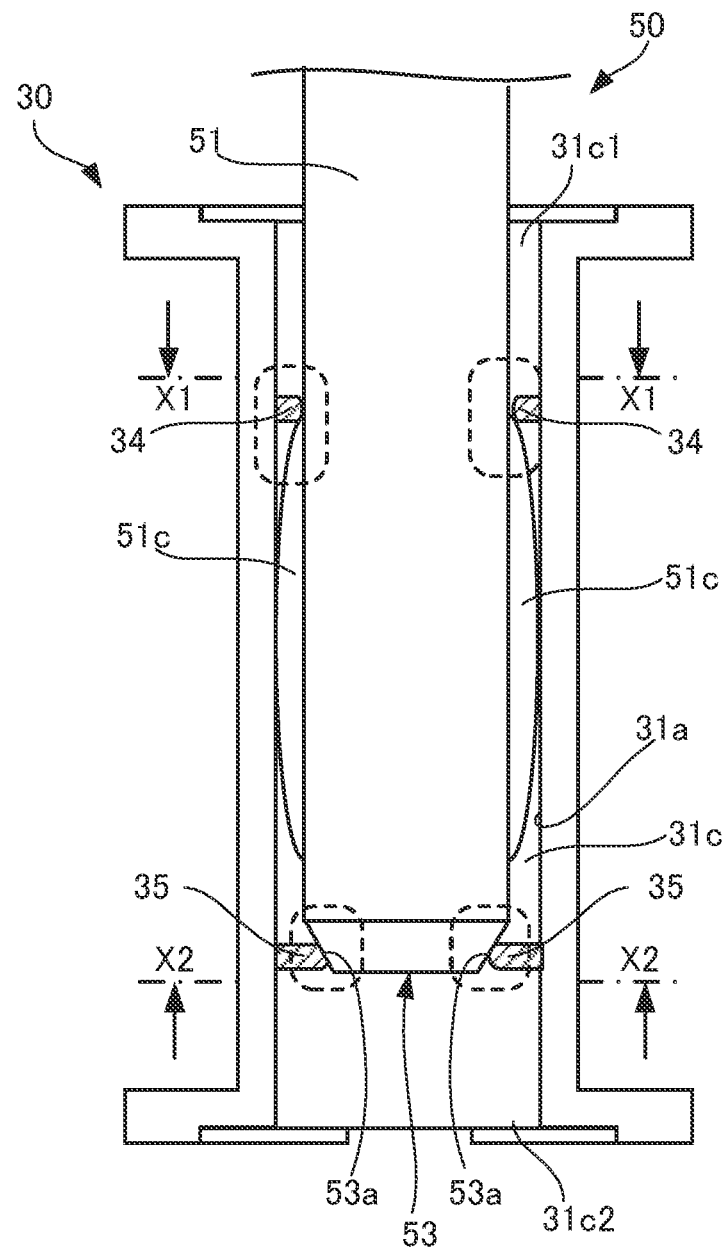
FIG. 7 is a side sectional view after the insertion of the external connection terminal into the contact part provided in the semiconductor device according to the first embodiment.

The following describes insertion of the external connection terminal 50 into the contact part 30 with reference to FIGS. 6 to 9. FIG. 6 is a side sectional view before the insertion of the external connection terminal into the contact part provided in the semiconductor device according to the first embodiment. FIG. 7 is a side sectional view after the insertion of the external connection terminal into the contact part provided in the semiconductor device according to the first embodiment. FIGS. 8A and 8B are plane sectional views after the insertion of the external connection terminal into the contact part provided in the semiconductor device according to the first embodiment. In this connection, in FIGS. 6 and 7, a circuit pattern 12 on which the contact part 30 is disposed is not illustrated. In addition, only reference numerals used in the explanation are indicated in FIGS. 6 and 7. FIG. 8A is a sectional view taken along the dot-dashed line X1-X1 of FIG. 7, and FIG. 8B is a sectional view taken along the dot-dashed line X2-X2 of FIG. 7. In addition, FIG. 9 corresponds to FIG. 8A and illustrates the case where the contact part 30 and external connection terminal 50 have different dimensions from those of FIG. 8A.

First, as illustrated in FIG. 6, the end portion 53 of the external connection terminal 50 is inserted into the through-hole 31c of the contact part from the opening end 31c1. Since the end portion has the tapered surface 53a, the external connection terminal 50 is easily inserted into the opening end 31c1 of the through-hole 31c. Then, the external connection terminal 50 is further inserted toward the opening end 31c2. In the following, the direction from the opening end 31c1 toward the opening end 31c2 is taken as an insertion direction. Since the thick portions 51c each have the curved extraction prevented surface 51c3, the thick portions 51c of the external connection terminal 50 are able to pass through the extraction preventing portion 34 formed in the through-hole 31c. In this connection, when the thick portions 51c pass through the extraction preventing portion 34, the through-hole 31c is entirely expanded, so that the thick portions 51c and extraction preventing portion 34 keep their shapes without being crushed even though they come to abut on each other. Then, after the thick portions 51c pass through the extraction preventing portion 34, the through-hole 31c almost returns back to the original shape.

Then, when the external connection terminal 50 is further inserted after the thick portions 51c pass through the extraction preventing portion 34, the tapered surface 53a of the end portion 53 faces the insertion preventing portion 35 of the through-hole 31c, as illustrated in FIG. 7. The tapered surface 53a of the end portion 53 serves as an insertion prevented portion. At this time, the tapered surface 53a (insertion prevented portion) of the external connection terminal 50 only needs to abut on the insertion preventing portion 35 so that further insertion of the external connection terminal 50 is prevented. When the further insertion is prevented, the tip surface of the end portion 53 may be located above, at the same level as, or below the insertion preventing portion 35. That is, when the further insertion of the external connection terminal 50 is prevented by the contact part 30 in this manner, the insertion preventing portion 35 is located on the downstream side of the main body portion 51 of the external connection terminal 50 inserted into the through-hole 31c in the insertion direction and abuts on the tapered surface 53a (insertion prevented portion). In addition, when abutted on by the tapered surface 53a (insertion prevented portion) of the external connection terminal 50, the insertion preventing portion 35 is not crushed by the abutting but protrudes from the inner circumferential surface 31a toward the center and almost keeps its shape.

In addition, at this time, the external connection terminal 50 is press-fitted in the through-hole 31c with the thick portions 51c of the external connection terminal 50 contacting the inner circumferential surface 31a of the through-hole 31c. In addition, the thick portions 51c (the tops thereof) of the external connection terminal 50 abut on the extraction preventing portion 34 of the through-hole 31c. In this connection, the thick portions 51c (the tops thereof) of the external connection terminal 50 may have some space from the extraction preventing portion 34 of the through-hole 31c without abutting on the extraction preventing portion 34. That is, when the external connection terminal 50 is inserted into the through-hole 31c, the thick portions 51c are located between the extraction preventing portion 34 and the insertion preventing portion 35. Especially, when the thick portions 51c (the tops thereof) of the external connection terminal 50 abut on the extraction preventing portion 34 of the through-hole 31c, the thick portions 51c of the external connection terminal 50 are caught by the extraction preventing portion 34, and the tapered surface 53a thereof is caught by the insertion preventing portion 35. In addition, even when abutted on by the thick portions 51c, the extraction preventing portion 34 is not crushed by the abutting but protrudes from the inner circumferential surface 31a toward the center and almost keeps its shape. Thus, the external connection terminal 50 is press-fitted in the through-hole 31c and is fixed by the extraction preventing portion 34 and the insertion preventing portion 35.

Figure 8A:
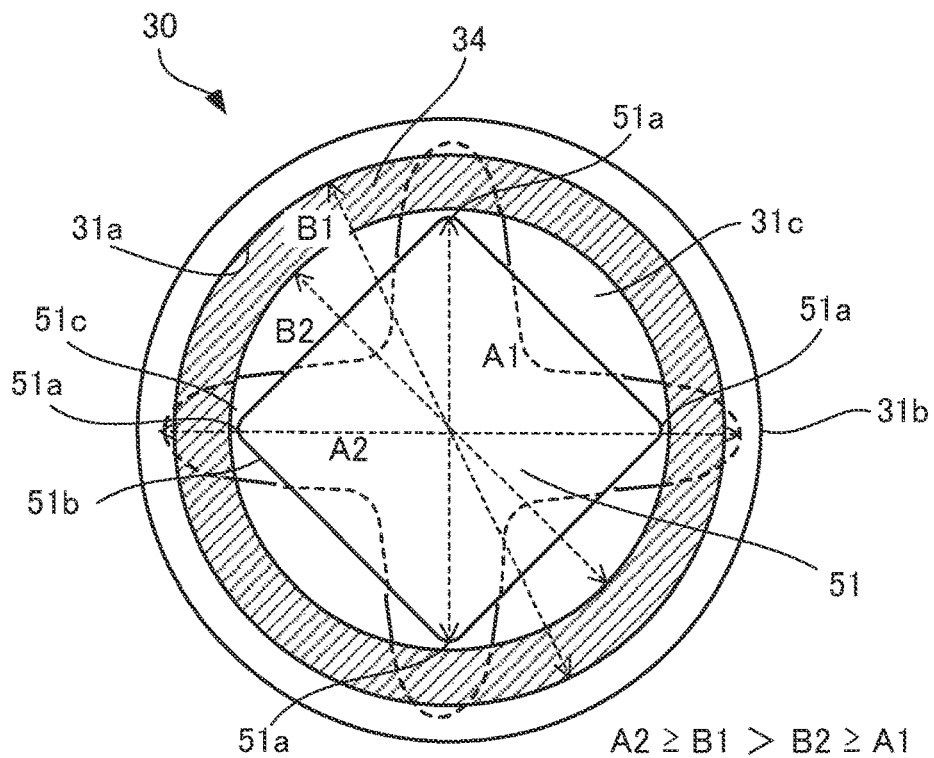
FIGS. 8A and 8B are first plane sectional views after the insertion of the external connection terminal into the contact part provided in the semiconductor device according to the first embodiment.
Figure 8B:
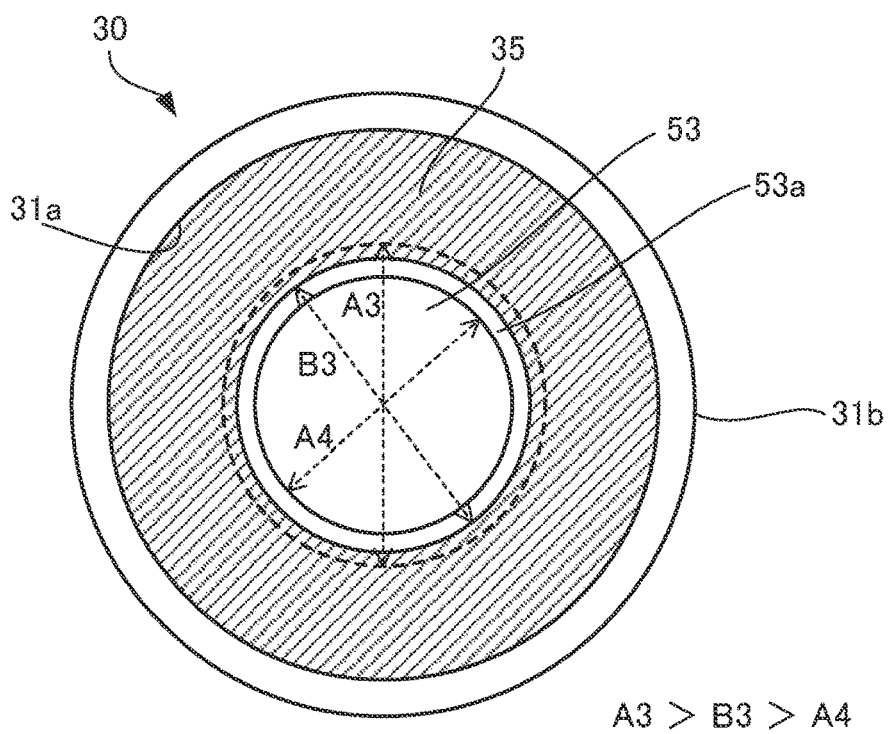

For inserting the external connection terminal 50 into the contact part 30 as described above, the contact part 30 and external connection terminal 50 are configured to have dimensions satisfying, with respect to the extraction preventing portion 34, "length A2≥inner diameter B1>inner diameter B2≥length A1", as illustrated in FIG. 8A. In the case of "length A2=inner diameter B1," the external connection terminal 50 may be press-fitted in the contact part 30 even in the cross-sectional direction. Especially, in the case of "length A2>the inner diameter B1," the inner circumferential surface 31a of the contact part 30 is partly recessed by the pressing of the thick portions 51c of the external connection terminal 50, so that the external connection terminal 50 is more firmly press-fitted in the contact part 30. In addition, the contact part 30 and external connection terminal 50 are configured to have dimensions satisfying, with respect to the insertion preventing portion 35, "diameter A3>inner diameter B3>diameter A4", as illustrated in FIG. 8B. By doing so, the tapered surface 53a is reliably caught by the insertion preventing portion 35.

Figure 9:
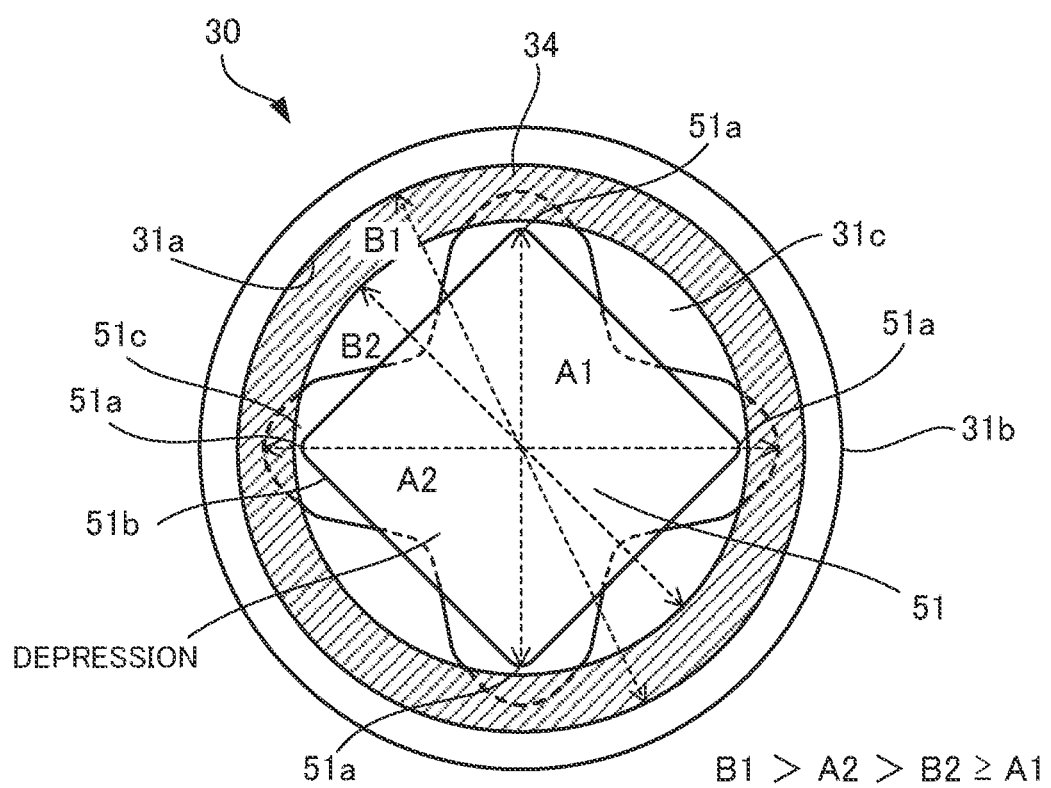
FIG. 9 is a second plane sectional view after insertion of an external connection terminal into a contact part provided in the semiconductor device according to the first embodiment.

Alternatively, the contact part 30 and external connection terminal 50 may be configured to have dimensions satisfying "inner diameter B1>length A2>inner diameter B2≥length A1," as illustrated in FIG. 9. In this case, the contact part 30 and the external connection terminal 50 have some space therebetween in the cross-sectional direction, which means that press-fitting does not seem to be needed. Even in this case, the thick portions 51c of the external connection terminal 50 are caught by the extraction preventing portion 34 and the tapered surface 53a thereof is caught by the insertion preventing portion 35, and therefore the external connection terminal 50 is press-fitted in the through-hole 31c and is fixed by the extraction preventing portion 34 and insertion preventing portion 35.

The contact part 30 and external connection terminal 50 have fitting dimensions as illustrated in FIGS. 8A, 8B and 9, which enables the insertion preventing portion 35 of the contact part 30 to prevent the external connection terminal 50 from being too much inserted into the contact part 30. Thus, a fixed indentation load for inserting the external connection terminal 50 into the contact part 30 is ensured. By pressing the plurality of external connection terminals 50 into the plurality of contact parts 30 with the fixed indentation load, it is possible to reliably press-fit the plurality of external connection terminals 50 into the plurality of contact parts 30 and to make the heights of the plurality of external connection terminals 50 equal to each other. Thereby, it is possible to reliably and securely attach a printed circuit board to the plurality of external connection terminals 50 of the semiconductor device 1 and to reduce the occurrence of damage in the semiconductor device 1.

In addition, the contact part 30 has the extraction preventing portion 34 formed on the upstream side of the insertion preventing portion 35 in the insertion direction. This ensures a fixed extraction load for extracting the external connection terminal 50 from the contact part 30. Therefore, without a force exceeding the extraction load, it is not possible to extract the external connection terminal 50.

The above-described semiconductor device 1 includes the circuit pattern 12, the contact part 30 having the cylindrical through-hole 31c formed therein and one opening end 31c2 joined to the circuit pattern 12, and the external connection terminal 50 having the prismatic main body portion 51 whose end portion 53 is inserted into the through-hole 31c. The external connection terminal 50 also has the tapered surface 53a at the end portion 53 of the main body portion 51. The contact part 30 has the insertion preventing portion 35 formed on the inner circumferential surface 31a of the through-hole 31c. In this connection, the insertion preventing portion 35 is located on the downstream side of the main body portion 51 of the external connection terminal 50 inserted into the through-hole 31c in the insertion direction and abuts on the tapered surface 53a. Therefore, a fixed indentation load for inserting the external connection terminal 50 into the contact part 30 is ensured. Thus, by pressing the plurality of external connection terminals 50 into the plurality of contact parts 30 with the fixed indentation load, it is possible to reliably press-fit the plurality of external connection terminals 50 into the plurality of contact parts 30 and to make the heights of the plurality of external connection terminals 50 equal to each other.

Second Embodiment

Figure 10:
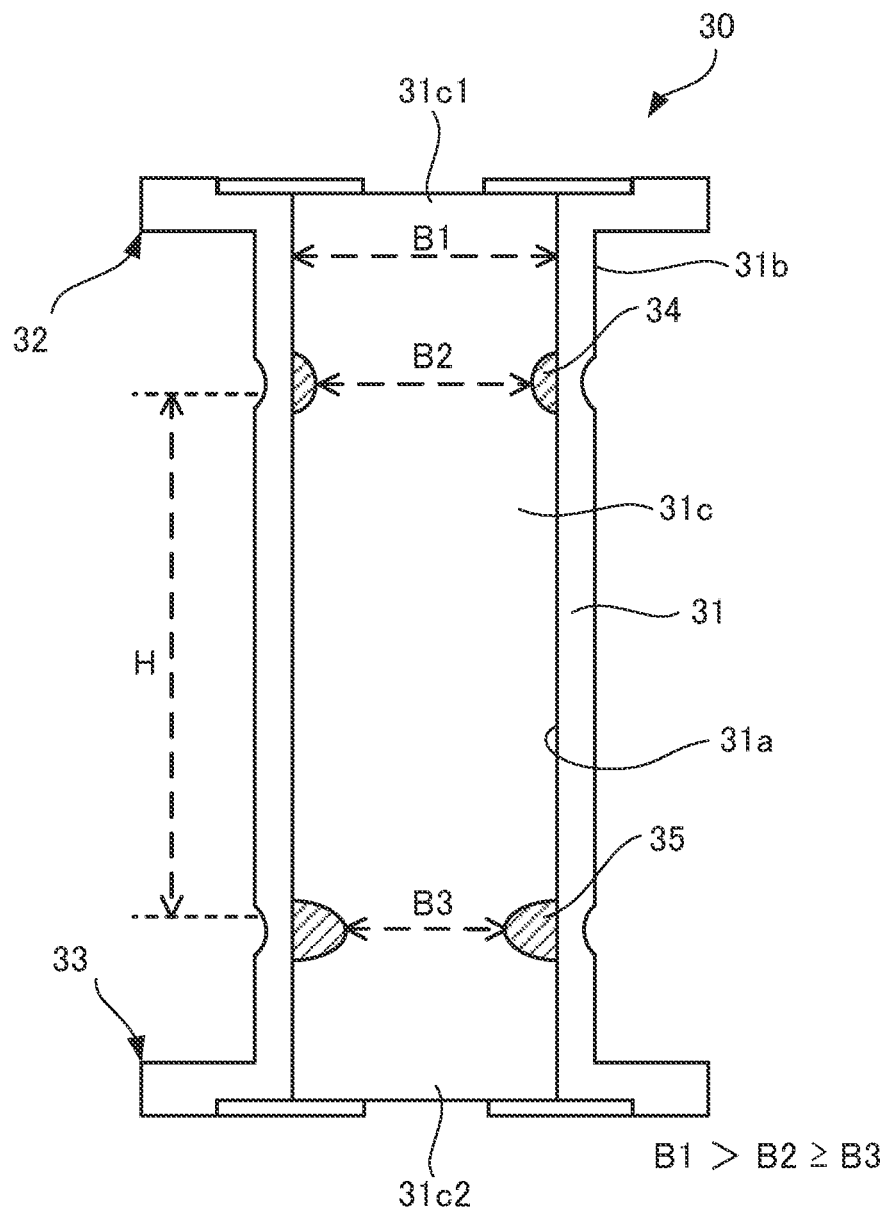
FIG. 10 is a view for explaining a contact part provided in a semiconductor device according to a second embodiment.
Figure 11:
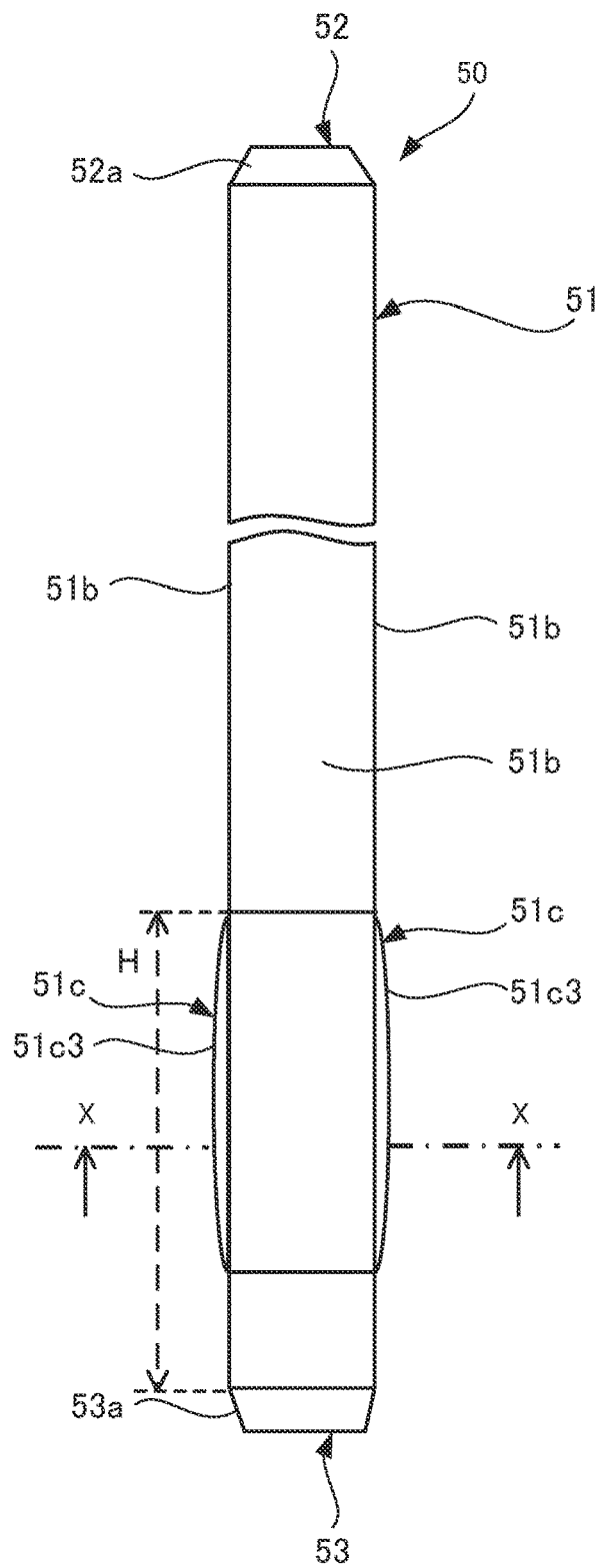
FIG. 11 is a front view of an external connection terminal provided in the semiconductor device according to the second embodiment.
Figure 12A:
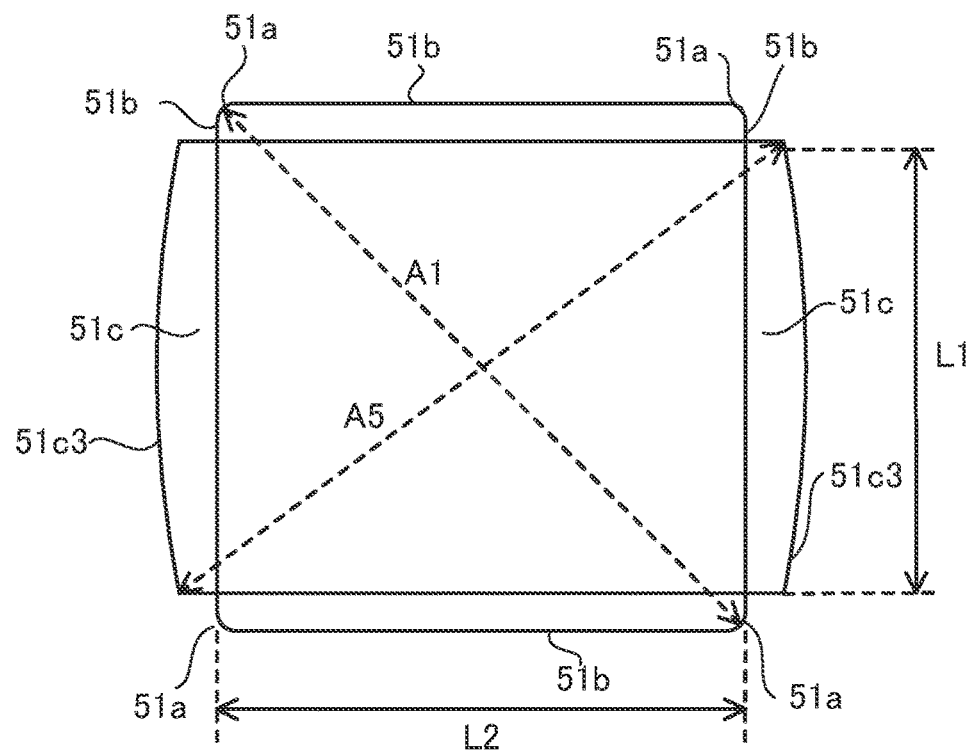
FIGS. 12A and 12B are plane sectional views of the external connection terminal provided in the semiconductor device according to the second embodiment.
Figure 12B:
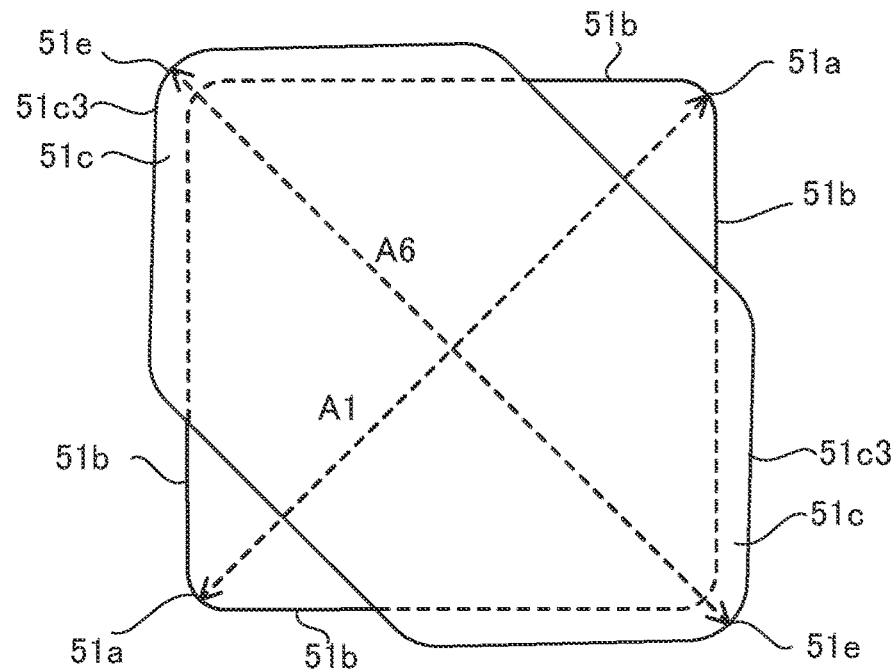

The second embodiment uses a contact part and an external connection terminal 50 that are different from those of the first embodiment. The second embodiment, however, uses the same semiconductor device 1 as the first embodiment. The following describes the contact part 30 and external connection terminal 50 of the second embodiment with reference to FIGS. 10, 11, 12A, and 12B. FIG. 10 is a view for explaining the contact part provided in the semiconductor device according to the second embodiment. FIG. 11 is a front view of the external connection terminal provided in the semiconductor device according to the second embodiment. FIGS. 12A and 12B are plane sectional view of the external connection terminal provided in the semiconductor device according to the second embodiment. In this connection, FIGS. 12A and 12B are both sectional views taken along the dot-dashed line X-X of FIG. 11, and FIG. 12B is a sectional view different from that of FIG. 12A.

As in the first embodiment, the contact part 30 of the second embodiment illustrated in FIG. has a body portion 31 and flanges 32 and 33 provided at both opening ends 31c1 and 31c2 of the body portion 31. In this connection, with respect to the contact part 30 of the second embodiment, an extraction preventing portion 34 and an insertion preventing portion 35 are formed in the inner circumferential surface 31a by applying pressure at prescribed positions of the outer circumferential surface 31b of the body portion 31 around the outer circumference of the outer circumferential surface 31b toward the center of the body portion 31. In this case as well, each of the extraction preventing portion 34 and insertion preventing portion 35 may be formed in a ring in the inner circumferential surface 31a and protrudes toward the center of the through-hole 31c. Alternatively, each of the extraction preventing portion 34 and insertion preventing portion may be formed discontinuously around the inner circumference. In addition, in the contact part 30 of the second embodiment, the extraction preventing portion 34 and insertion preventing portion 35 are formed to have dimensions satisfying, with respect to the inner circumferential surface 31a, "inner diameter B1>inner diameter B2≥inner diameter B3."

As in the first embodiment, the external connection terminal 50 of the second embodiment illustrated in FIG. 11 includes a prismatic main body portion 51 and frustoconical end portions 52 and 53. However, in the second embodiment, thick portions 51c are provided on a pair of opposite outer surfaces 51b of the main body portion 51 and protrude outward from those outer surfaces 51b (see FIG. 12A). For example, the thick portions 51c are formed by deformation processing that involves sandwiching and pressing the main body portion 51 from a pair of opposite outer surfaces 51b (on which the thick portions 51c are not formed) in the direction approaching each other. These thick portions 51c serve as an extraction prevented portion and have extraction prevented surfaces 51c3 on their outer surfaces. The extraction prevented surfaces 51c3 have a prescribed length in a direction parallel to the insertion direction. Each extraction prevented surface 51c3 is a curved surface such that the extraction prevented surface 51c3 gets more distant from the main body portion 51 as it gets farther from the end portion 52 toward the end portion 53, is the most distant from the main body portion 51 at its center, and gets closer to the main body portion 51 as it gets closer to the end portion 53 beyond the center. In addition, the diagonal length A5 of the thick portions 51c sandwiching the main body portion 51 is set greater than the diagonal length A1 of the main body portion 51 (i.e., A5>A1).

Alternatively, as illustrated in FIG. 12B, thick portions 51c are formed at a pair of opposite edges 51a of the main body portion 51 and protrude outward from the edges 51a.

These thick portions 51c serve as an extraction prevented portion, and as in FIG. 12A, have curved extraction prevented surfaces 51c3 on their outer surfaces. In this connection, the edges 55e of the extraction prevented surfaces 51c3 are rounded, as illustrated in FIG. 5B. These thick portions 51c are formed by performing deformation processing on the main body portion 51. That is, the thick portions 51c are formed by sandwiching and pressing the main body portion 51 from a pair of opposite edges 51a toward the center of the main body portion 51. As a result of the deformation processing, the pressed surfaces are perpendicular to the diagonal line of the main body portion 51, and the thick portions 51c are formed at the edges 51a of the main body portion 51 and protrude outward from the edges 51a, as illustrated in FIG. 12B. In addition, the length A6 between the edges 55e of the thick portions 51c opposite to each other with the center of the main body portion 51 therebetween is set greater than the diagonal length A1 of the main body portion 51 (i.e., A6>A1).

Figure 13:
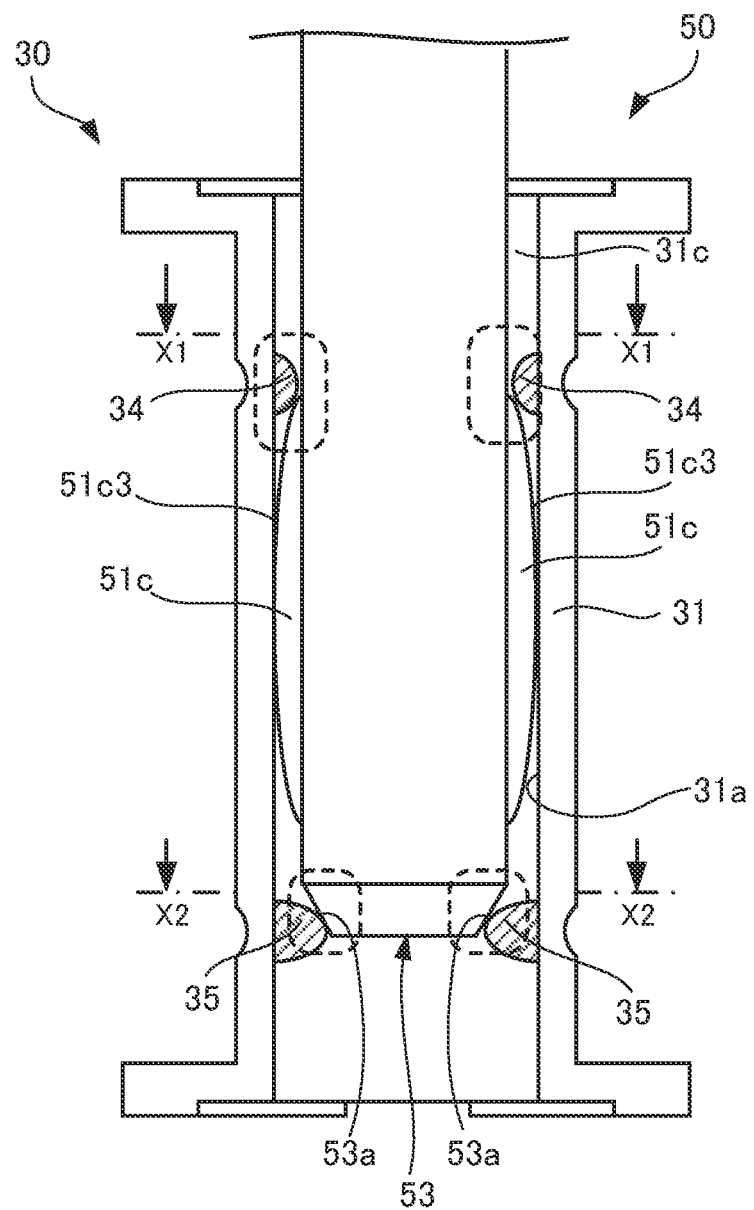
FIG. 13 is a side sectional view after insertion of the external connection terminal into the contact part provided in the semiconductor device according to the second embodiment.
Figure 14A:
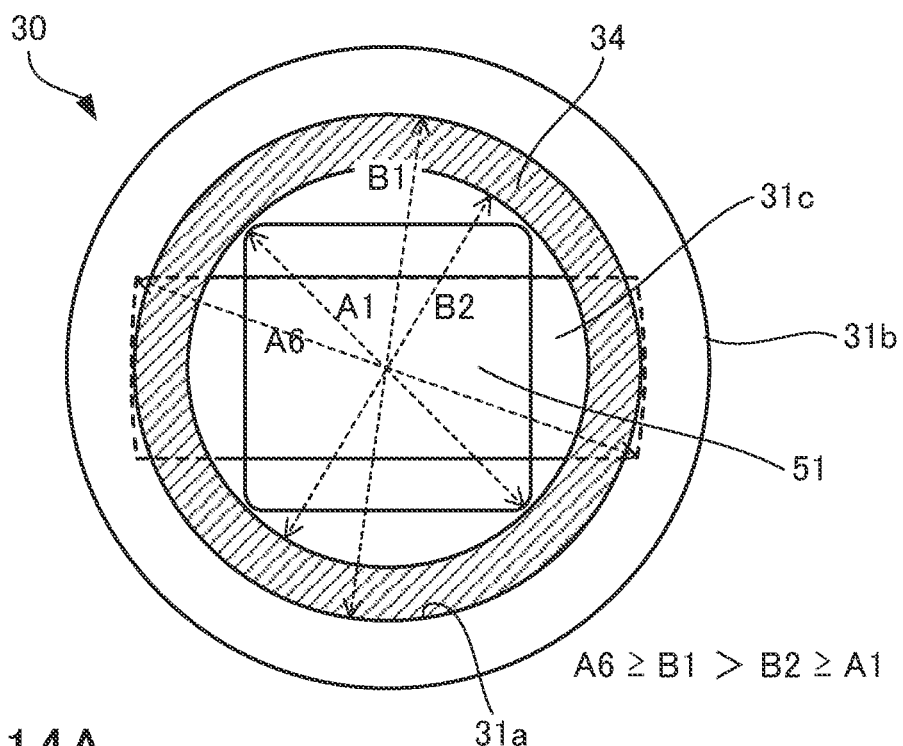
FIGS. 14A and 14B are first plane sectional views after the insertion of the external connection terminal into the contact part provided in the semiconductor device according to the second embodiment.
Figure 14B:
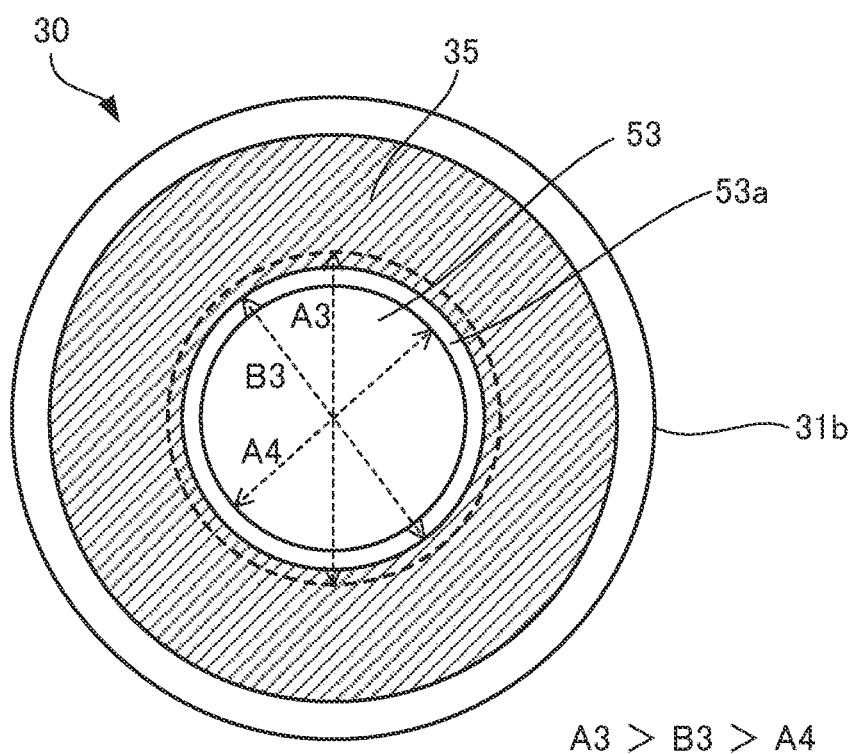
Figure 15:
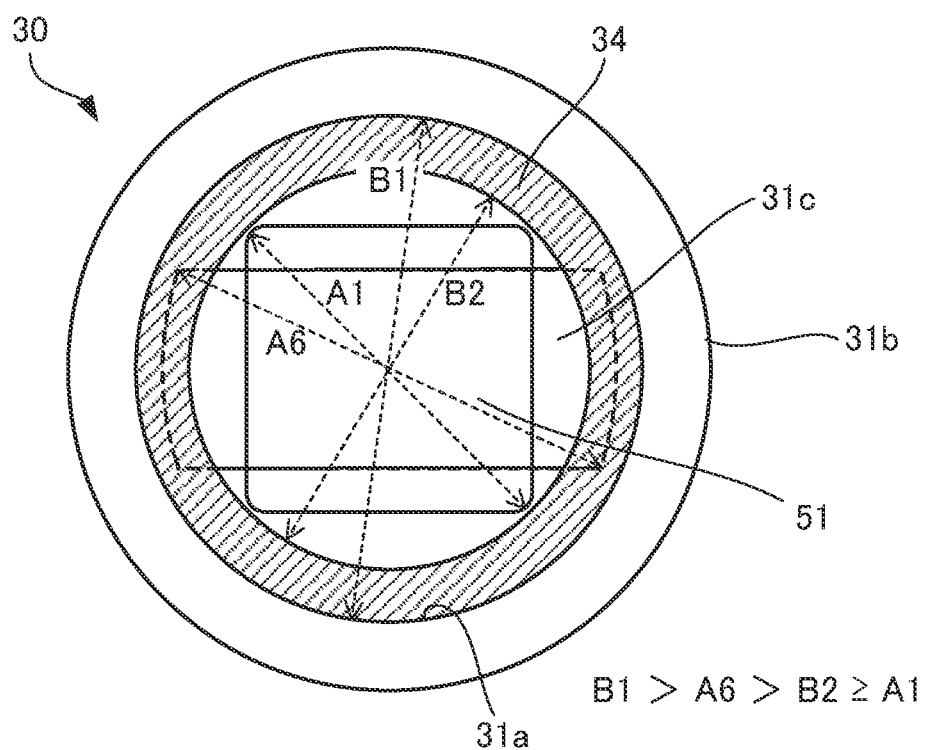
FIG. 15 is a second plane sectional view after the insertion of the external connection terminal into the contact part provided in the semiconductor device according to the second embodiment.

The following describes insertion of the external connection terminal 50 into the contact part with reference to FIGS. 13 to 15. In this connection, the insertion of the external connection terminal 50 in the case of FIG. 12A will be described. FIG. 13 is a side sectional view after the insertion of the external connection terminal into the contact part provided in the semiconductor device according to the second embodiment. FIGS. 14A, 14B, and 15 are plane sectional view after the insertion of the external connection terminal into the contact part provided in the semiconductor device according to the second embodiment. Only reference numerals to be used in the explanation are indicated in FIGS. 13 to 15. In addition, FIG. 14A is a sectional view taken along the dot-dashed line X1-X1 of FIG. 13, and FIG. 14B is a sectional view taken along the dot-dashed line X2-X2 of FIG. 13. In addition, FIG. 15 corresponds to FIG. 14A and illustrates the case where the contact part 30 and external connection terminal 50 have different dimensions from those of FIG. 14A.

First, as in the first embodiment, the end portion 53 of the external connection terminal 50 is inserted into the through-hole 31c of the contact part 30 from the opening end 31c1 (see FIG. 6). Since the end portion 53 has a tapered surface 53a, the external connection terminal 50 is easily inserted into the opening end 31c1 of the through-hole 31c. Then, the external connection terminal 50 is further inserted toward the opening end 31c2. Since the extraction prevented surfaces 51c3 of the thick portions 51c are curved surfaces, the thick portions 51c of the external connection terminal 50 are able to pass through the extraction preventing portion 34.

When the external connection terminal 50 is further inserted after the thick portions 51c pass through the extraction preventing portion 34, the tapered surface 53a of the end portion 53 faces the insertion preventing portion 35 of the through-hole 31c, as illustrated in FIG. 13. In this case as well, the tapered surface 53a (insertion prevented portion) of the end portion 53 only needs to abut on the insertion preventing portion 35 so that further insertion of the external connection terminal 50 is prevented by the insertion preventing portion 35. When the further insertion is prevented, the tip surface of the end portion 53 may be located above, at the same level as, or below the insertion preventing portion 35. When the further insertion of the external connection terminal 50 is prevented by the contact part 30, the insertion preventing portion 35 is located on the downstream side of the main body portion 51 of the external connection terminal 50 inserted into the through-hole 31c in the insertion direction and abuts on the tapered surface 53a.

In addition, when abutted on by the tapered surface 53a of the external connection terminal 50, the insertion preventing portion 35 is not crushed by the abutting but almost keeps its shape.

In this case as well, as in the first embodiment, the external connection terminal 50 is press-fitted in the through-hole 31c with the thick portions 51c of the external connection terminal 50 contacting the inner circumferential surface 31a of the through-hole 31c. In addition, the thick portions 51c (the tops thereof) of the external connection terminal 50 may abut on the extraction preventing portion 34 or may have some space from the extraction preventing portion 34. That is, when the external connection terminal 50 is inserted into the through-hole 31c, the thick portions 51c are located between the extraction preventing portion 34 and the insertion preventing portion 35. Especially, when the thick portions 51c (the tops thereof) of the external connection terminal 50 abut on the extraction preventing portion 34 of the through-hole 31c, the thick portions 51c of the external connection terminal 50 are caught by the extraction preventing portion 34 and the tapered surface 53a thereof is caught by the insertion preventing portion 35. For this reason, the external connection terminal 50 is press-fitted in the through-hole 31c and is fixed by the extraction preventing portion 34 and insertion preventing portion 35.

For inserting the external connection terminal 50 into the contact part 30 as described above, the contact part 30 and external connection terminal 50 are configured to have dimensions satisfying, with respect to the extraction preventing portion 34, "length A6≥inner diameter B1>inner diameter B2≥length A1," as illustrated in FIG. 14A. In the case of "length A6=inner diameter B1," it is possible to press-fit the external connection terminal 50 in the contact part 30 even in the cross-sectional direction. Especially, in the case of "length A6>inner diameter B1," the inner circumference of the contact part 30 is partly recessed by pressing of the thick portions 51c of the external connection terminal 50, so that the external connection terminal 50 is press-fitted in the contact part 30 more firmly. In addition, the contact part 30 and external connection terminal 50 are configured to have dimensions satisfying, with respect to the insertion preventing portion 35, "diameter A3>inner diameter B3>diameter A4," as illustrated in FIG. 14B. Therefore, the tapered surface 53a is reliably caught by the insertion preventing portion 35.

Alternatively, the contact part 30 and external connection terminal 50 may be configured to have dimensions satisfying "inner diameter B1>length A6≥inner diameter B2≥length A1," as illustrated in FIG. 15. In this connection, the contact part 30 and external connection terminal 50 have some space therebetween in the cross-sectional direction, which means that press-fitting does not seem to be needed. Even in this case, the thick portions 51c of the external connection terminal 50 are caught by the extraction preventing portion 34 and the tapered surface 53a thereof is caught by the insertion preventing portion 35, and therefore the external connection terminal 50 is press-fitted in the through-hole 31c and is fixed by the extraction preventing portion 34 and the insertion preventing portion 35.

The contact part 30 and external connection terminal 50 have the above fitting dimensions. Therefore, as in the first embodiment, a fixed indentation load for inserting the external connection terminal 50 into the contact part 30 is ensured. Thus, by pressing a plurality of external connection terminals 50 into a plurality of contact parts 30 with the fixed indentation load, it is possible to reliably press-fit the plurality of external connection terminals 50 into the plurality of contact parts 30 and to make the heights of the plurality of external connection terminals 50 equal to each other. Thus, it is possible to reliably and securely attach a printed circuit board to the plurality of external connection terminals 50 of the semiconductor device 1 and to reduce the occurrence of damage in the semiconductor device 1.

Further, as in the first embodiment, a fixed extraction load of extracting the external connection terminal 50 from the contact part 30 is ensured. Therefore, without a force exceeding the extraction load, it is not possible to extract the external connection terminal 50.

Figure 16:
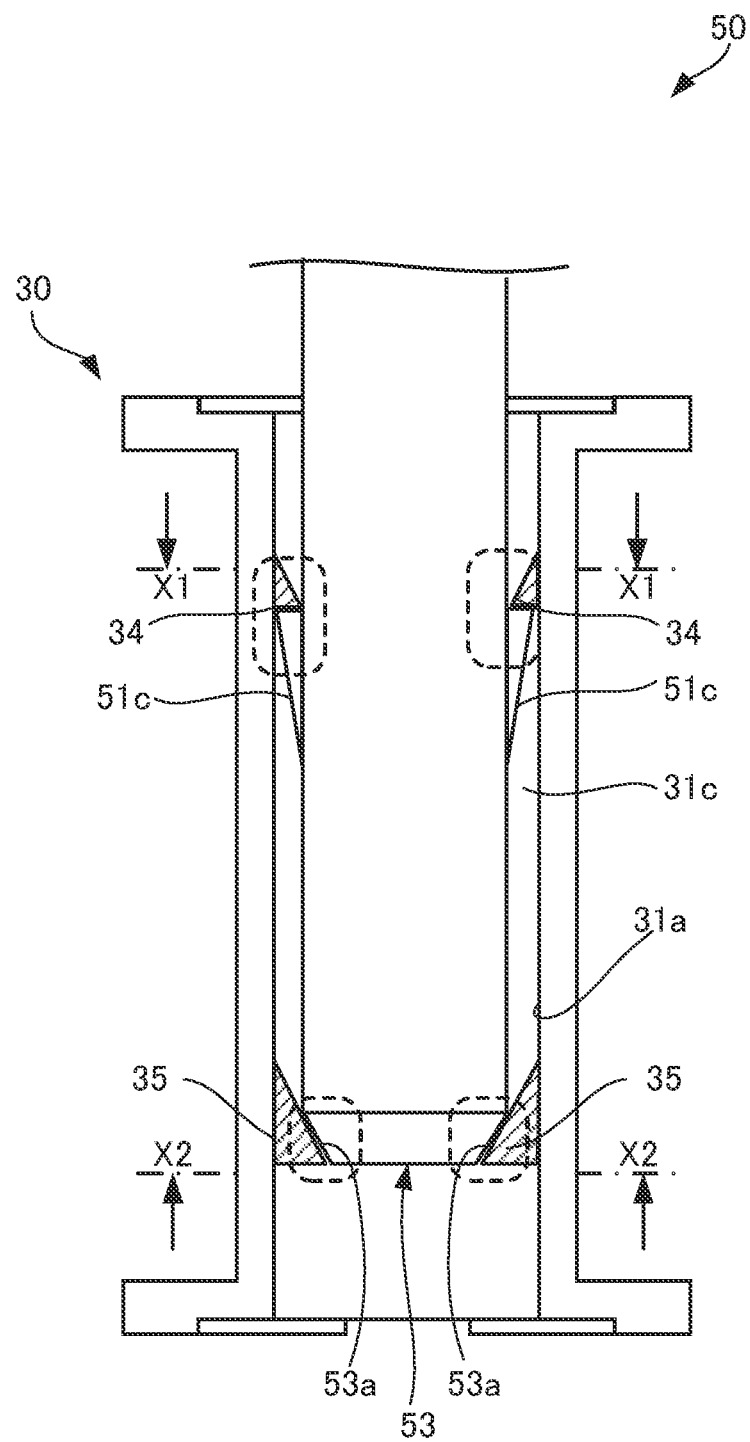
FIG. 16 is a first side sectional view after insertion of an external connection terminal into another contact part provided in the semiconductor device according to the second embodiment.
Figure 17:
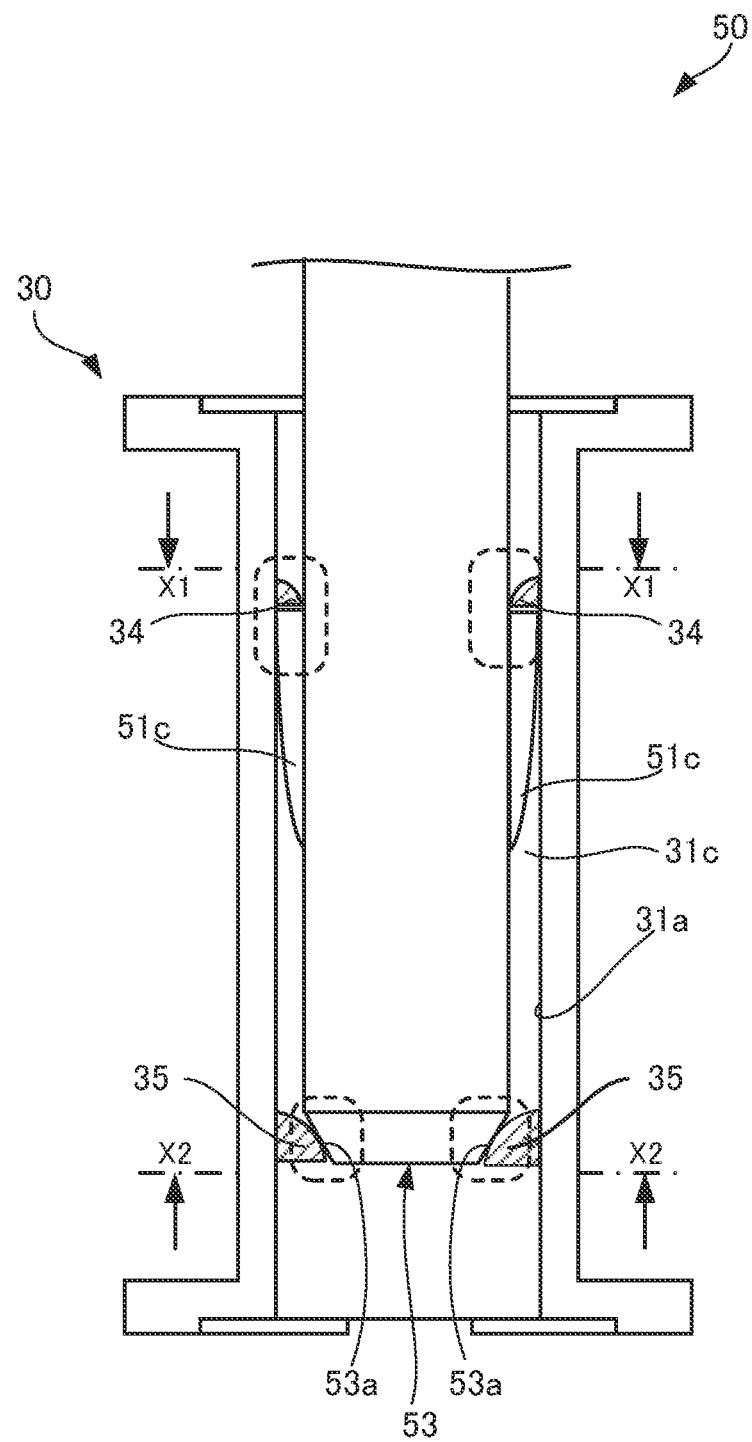
FIG. 17 is a second side sectional view after insertion of an external connection terminal into another contact part provided in the semiconductor device according to the second embodiment.

Another example of the extraction preventing portion 34 and insertion preventing portion provided in the contact part 30 and the thick portions 51c provided in the external connection terminal 50 will be described with reference to FIGS. 16 and 17. FIGS. 16 and 17 are each a side sectional view after insertion of an external connection terminal into another contact part provided in the semiconductor device according to the second embodiment.

As illustrated in FIG. 16, for example, an extraction preventing portion 34 and an insertion preventing portion 35 each may be formed to have a triangle cross section. In addition, each of the extraction preventing portion 34 and insertion preventing portion 35 may be formed in a ring on the inner circumferential surface 31a or may be formed discontinuously on the inner circumferential surface 31a as long as they are able to catch the external connection terminal 50. In addition, the extraction preventing portion 34 and insertion preventing portion 35 may be formed by performing deformation processing, grinding operations, lathe operations, cutting operations, or another on the inner circumferential surface 31a of the through-hole 31c. Alternatively, the extraction preventing portion 34 and insertion preventing portion 35 may be joined to the inner circumferential surface 31a of the through-hole 31c by heat, adhesive, and/or welding.

In keeping with the triangle cross section of the extraction preventing portion 34, thick portions 51c of the external connection terminal 50 are each formed to have an inverted triangle cross section. The thick portions 51c are formed to protrude outward from the outer surfaces 51b of the main body portion 51 as illustrated in FIGS. 5A and 5B or FIGS. 12A and 12B. The thick portions 51c serve as an extraction prevented portion and have extraction prevented surfaces on their outer surfaces. In addition, the thick portions 51 may be formed by performing deformation processing on the main body portion 51. The above thick portions 51c are able to pass through the extraction preventing portion 34 easily and to be caught by the extraction preventing portion 34 easily. Furthermore, the tilt angle of the insertion preventing portion 35 is preferably equal to that of the tapered surface 53a of the end portion 53 of the external connection terminal 50.

Referring now to FIG. 17, an extraction preventing portion 34 and insertion preventing portion 35 each may be formed to have a quadrant cross section. In addition, each of the extraction preventing portion and insertion preventing portion 35 may be formed in a ring on the inner circumferential surface 31a or may be formed discontinuously as long as they are able to catch the external connection terminal 50. The extraction preventing portion 34 and insertion preventing portion 35 may be formed by performing deformation processing, grinding operations, lathe operations, cutting operations, or another on the inner circumferential surface 31a of the through-hole 31c. Alternatively, the extraction preventing portion and insertion preventing portion 35 may be joined to the inner circumferential surface 31a of the through-hole 31c by heat, adhesive, and/or welding.

In keeping with the quadrant cross section of the extraction preventing portion 34, thick portions 51c of the external connection terminal 50 are each formed to have an inverted quadrant cross section. The thick portions 51c are formed to protrude outward from the outer surfaces 51b of the main body portion 51, as illustrated in FIGS. 5A and 5B or FIGS. 12A and 12B. The thick portions 51c serve as an extraction prevented portion and have extraction prevented surfaces on their outer surfaces. In addition, the thick portions 51 may be formed by performing deformation processing on the main body portion 51. The thick portions 51c are able to pass through the extraction preventing portion 34 easily and to be caught by the extraction preventing portion 34 easily. In the cases of FIGS. 16 and 17 as well, the inner diameter B1 of the through-hole 31c is set greater than the inner diameter B2 of the extraction preventing portion 34 and the inner diameter B3 of the insertion preventing portion 35, and the inner diameter B2 of the extraction preventing portion 34 is set greater than or equal to the inner diameter B3 of the insertion preventing portion 35 (i.e., inner diameter B1>inner diameter B2≥inner diameter B3). Even the contact part 30 and external connection terminal 50 illustrated in FIGS. 16 and 17 produce the same effects as in the first embodiment.

Third Embodiment

Figure 18:
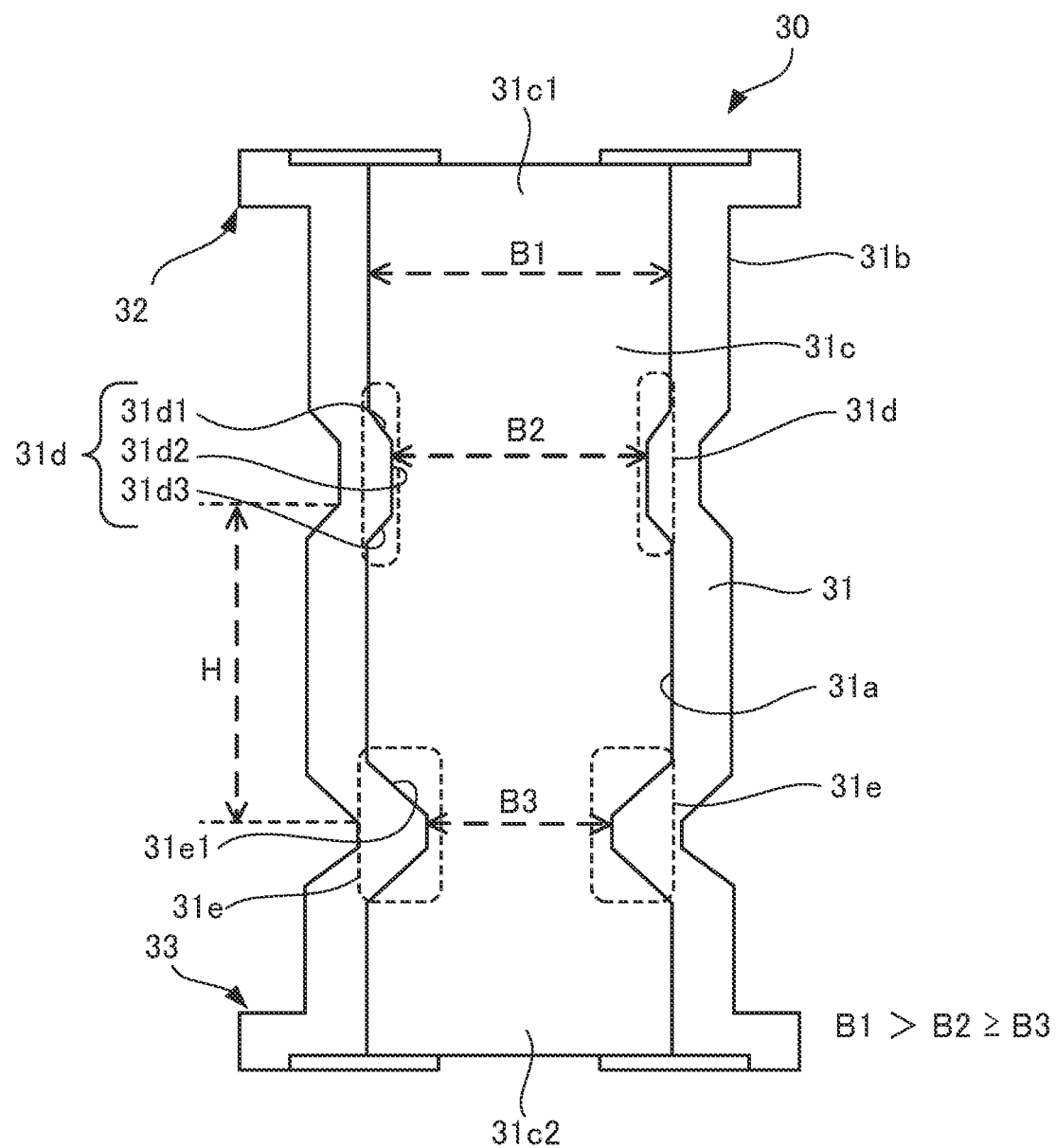
FIG. 18 is a view for explaining a contact part provided in a semiconductor device according to a third embodiment.
Figure 19B:
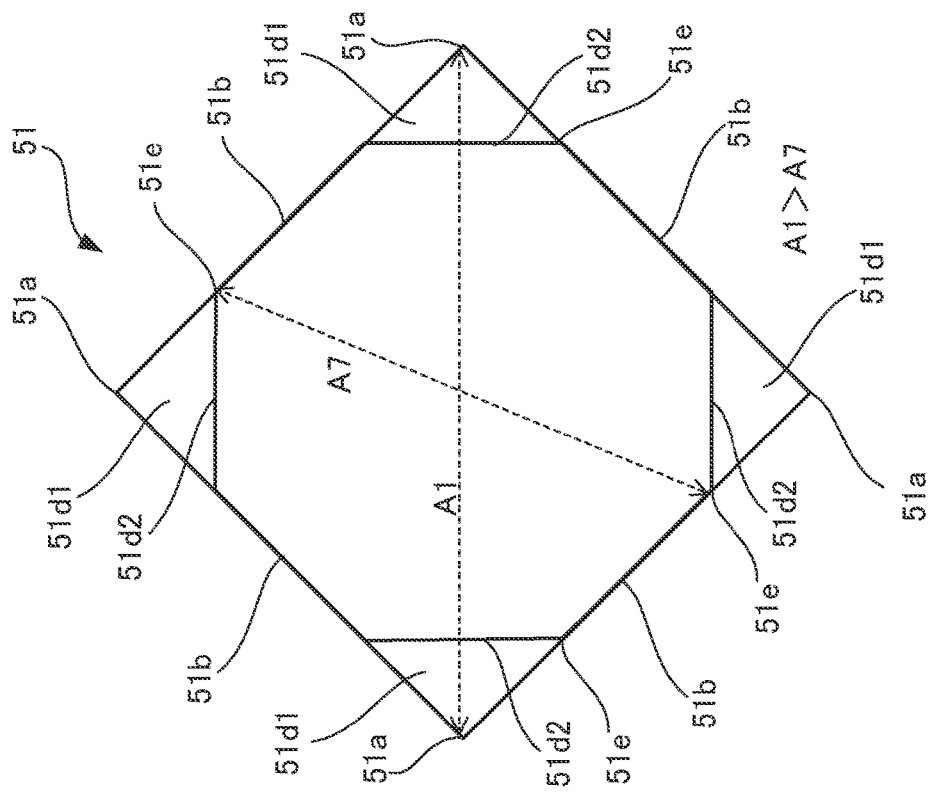
FIGS. 19A and 19B are views for explaining an external connection terminal provided in the semiconductor device according to the third embodiment.
Figure 19A:
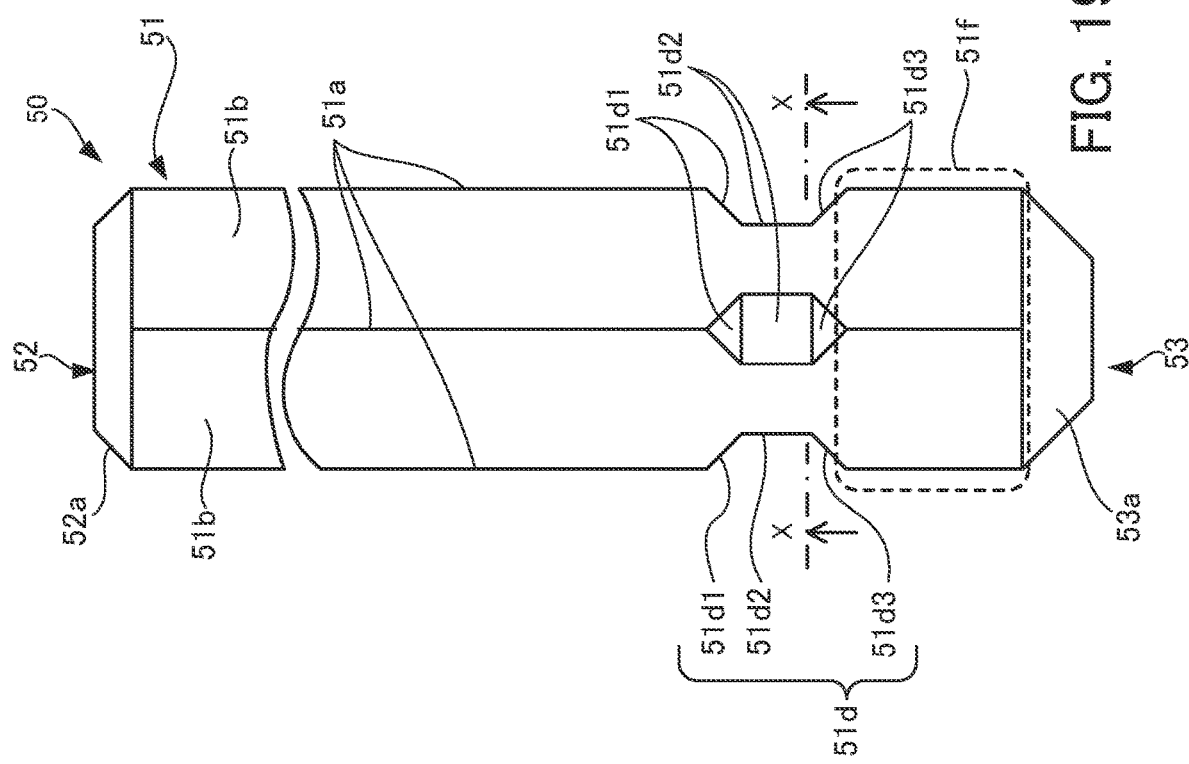

A contact part 30 and external connection terminal 50 of a third embodiment will be described with reference to FIGS. 18, 19A, and 19B. FIG. 18 is a view for explaining the contact part provided in a semiconductor device according to the third embodiment, and FIGS. 19A and 19B are views for explaining the external connection terminal provided in the semiconductor device according to the third embodiment. In this connection, FIG. 19A is a front view of the external connection terminal 50, and FIG. 19B is a plane sectional view taken along the dot-dashed line X-X of FIG. 19A.

The contact part 30 of the third embodiment illustrated in FIG. 18 includes a body portion 31 and flanges 32 and 33 provided on both opening ends 31c1 and 31c2 of the body portion 31. The body portion 31 has a cylindrical through-hole 31c formed therein, an inner circumferential surface 31a, and an outer circumferential surface 31b. The body portion 31 has an upper protrusion 31d formed on the side closer to the opening end 31c1 on the inner circumferential surface 31a of the through-hole 31c and a lower protrusion 35e formed on the side closer to the opening end 31c2 on the inner circumferential surface 31a. For example, this body portion 31 is formed by performing bulging on a rectangular blank plate to form the upper and lower protrusions 31d and 35e and then rolling the plate into a cylindrical shape. The body portion 31 may be formed by another method.

The upper protrusion 31d may be formed in a ring in the inner circumferential surface 31a or may be formed discontinuously as long as it is able to catch the external connection terminal 50. In addition, the upper protrusion 31d has an upper insertion preventing surface 31d1, a support surface 31d2, and an extraction preventing surface 31d3. The upper insertion preventing surface 31d1 is provided in the inner circumferential surface 31a and is inclined to a direction opposite to the insertion direction. That is, the upper insertion preventing surface 31d1 is inclined toward the opening end 31c1. More specifically, a side of the upper insertion preventing surface 31d1 closer to the opening end 31c2 is located further inside the through-hole 31c than another side of the upper insertion preventing surface 31d1 closer to the opening end 31c1. The support surface 31d2 is parallel to the insertion direction. The extraction preventing surface 31d3 is provided in the inner circumferential surface 31a and is inclined to the insertion direction. That is, the extraction preventing surface 31d3 is inclined toward the opening end 31c2.

In addition, the lower protrusion 35e may be formed in a ring in the inner circumferential surface 31a or may be formed discontinuously as long as it is able to catch the external connection terminal 50. This lower protrusion 35e has at least a lower insertion preventing surface 35e1. The lower insertion preventing surface 35e1 is inclined to a direction opposite to the insertion direction. That is, the lower insertion preventing surface 35e1 is inclined toward the opening end 31c1. More specifically, a side of the lower insertion preventing surface 35e1 closer to the opening end 31c2 is located further inside the through-hole 31c than another side of the lower insertion preventing surface 35e1 closer to the opening end 31c1. In this body portion 31, the inner diameter B1 of the through-hole 31c is set greater than the inner diameter B2 of the upper protrusion 31d and the inner diameter B3 of the lower protrusion 35e, and the inner diameter B2 of the upper protrusion 31d is set greater than or equal to the inner diameter B3 of the lower protrusion 35e (i.e., inner diameter B1>inner diameter B2≥inner diameter B3). In addition, taking the height (length) from the upper protrusion 31d to the lower protrusion 35e as H, the height H is set so that a head portion 51f of the external connection terminal 50 inserted into the contact part 30 is contained within the height H, as will be described later. That is, the height H is equal to or a little less than the length from the top of the tapered surface 53a (insertion prevented portion) of the external connection terminal 50 to the top of the extraction prevented surface 51d3. The height H is preferably in a range from 80% to 100%, inclusive, of the length from the top of the tapered surface 53a (insertion prevented portion) of the external connection terminal 50 to the top of the extraction prevented surface 51d3. The flanges 32 and 33 are formed at both the opening ends 31c1 and 31c2 of the through-hole 31c of the body portion 31. The outer diameter of each flange 32 and 33 is greater than that of the body portion 31.

As in the first embodiment, the external connection terminal 50 of the third embodiment includes a main body portion 51 and end portions 52 and 53, as illustrated in FIG. 19A. Note that in the third embodiment, a depression 51d is formed at each edge 51a of the main body portion 51 on the upstream side of the end portion 53 in the insertion direction. Each depression 51d includes an insertion prevented portion and an extraction prevented portion. The third embodiment describes the case where the depression 51d is formed at each of the four edges 51a of the main body portion 51. The depressions 51d are not limited to this configuration and may be formed at at least a pair of opposite edges 51a of the main body portion 51. In addition, each depression 51d has an insertion prevented surface 51d1, supported surface 51d2, and extraction prevented surface 51d3. The insertion prevented portion is a portion with the insertion prevented surface 51d1. The extraction prevented portion is a portion with the extraction prevented surface 51d3. The insertion prevented surface 51d1 is provided in the main body portion 51 and is inclined to a direction opposite to the insertion direction. That is, the insertion prevented surface 51d1 is inclined toward the end portion 53. More specifically, a side of the insertion prevented surface 51d1 closer to the end portion 53 is located further inside the body portion 51 than another side of the insertion prevented surface 51d1 closer to the end portion 52. The supported surface 51d2 is formed parallel to the insertion direction. The extraction prevented surface 51d3 is provided in the main body portion 51 and is inclined to the insertion direction. That is, the extraction prevented surface 51d3 is inclined toward the end portion 52. In this connection, in the external connection terminal 50, a portion from the end portion 53 to the depressions 51d is taken as the head portion 51f. In addition, in the external connection terminal 50, a diagonal length A1 of the main body portion 51 is set greater than the length A7 of a diagonal line (longest diagonal line) of the depressions 51d that passes through the center of the main body portion 51, in a plan view, and connects edges of the depressions, as illustrated in FIG. 19B (i.e., length A1>length A7). Such depressions 51d are formed by deformation processing, grinding operations, lathe operations, cutting operations, or another.

Figure 20:
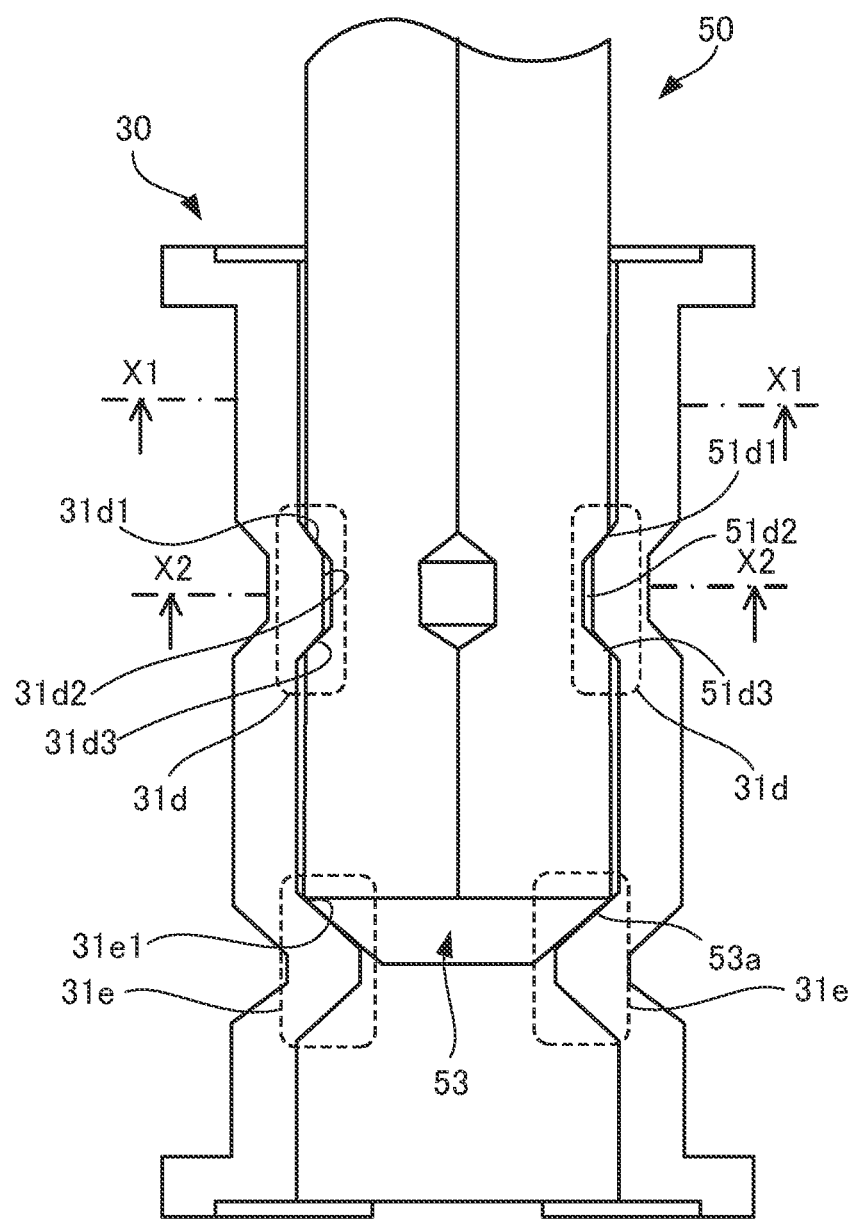
FIG. 20 is a side sectional view after insertion of the external connection terminal into the contact part provided in the semiconductor device according to the third embodiment.

The following describes insertion of the contact part 30 into the external connection terminal 50 with reference to FIGS. 20, 21A, and 21B. FIG. 20 is a side sectional view after the insertion of the external connection terminal into the contact part provided in the semiconductor device according to the third embodiment. FIGS. 21A and 21B are plane sectional views after the insertion of the external connection terminal into the contact part provided in the semiconductor device according to the third embodiment. In this connection, FIG. 21A is a sectional view taken along the dot-dashed line X1-X1 of FIG. 20, and FIG. 21B is a sectional view taken along the dot-dashed line X2-X2 of FIG. 20.

First, as in the first embodiment, the end portion 53 of the external connection terminal 50 is inserted into the through-hole 31c of the contact part 30 from the opening end 31c1 (see FIG. 6). Since the end portion 53 has a reduced diameter, the external connection terminal 50 is inserted into the opening end 31c1 of the through-hole 31c easily. Then, the external connection terminal 50 is further inserted toward the opening end 31c2. While the tapered surface 53a of the end portion 53 slides on the upper insertion preventing surface 31d1 of the upper protrusion 31d, the head portion 51f rides on the upper protrusion 31d. When the external connection terminal 50 is further inserted, the head portion 51f passes through the upper protrusion 31d and the tapered surface 53a of the end portion 53 comes to abut on the lower insertion preventing surface 35e1 of the lower protrusion 35e of the through-hole 31c, as illustrated in FIG. 20. When the head portion 51f passes through the upper protrusion 31d, the through-hole 31c is entirely expanded, and when abutted on by the external connection terminal 50, the upper protrusion 31d is not crushed by the abutting but almost keeps its shape. After the head portion 51f passes through the upper protrusion 31d, the through-hole 31c almost returns back to its shape. In this connection, further insertion of the external connection terminal 50 only needs to be prevented by the lower protrusion 35e, and the tip surface of the end portion 53 may be located above, at the same level as, or below the lower insertion preventing surface 35e1. When the further insertion of the external connection terminal 50 is prevented by the contact part 30, the lower insertion preventing surface 35e1 is located on the downstream side of the main body portion 51 of the external connection terminal 50 inserted into the through-hole 31c in the insertion direction and abuts on the tapered surface 53a. In addition, at this time, the external connection terminal 50 is inserted into the through-hole 31c with the head portion 51f of the external connection terminal 50 contacting the inner circumferential surface 31a (between the upper protrusion 31d and lower protrusion 35e) of the through-hole 31c.

In addition, at this time, the upper protrusion 31d of the contact part 30 fits the depressions 51d of the external connection terminal 50. In addition, the extraction prevented surfaces 51d3 of the depressions 51d of the external connection terminal 50 abut on the extraction preventing surface 31d3 of the upper protrusion 31d. In the manner described above, the external connection terminal 50 is inserted into the contact part 30. For inserting the external connection terminal 50 into the contact part 30, the contact part 30 and external connection terminal 50 are configured to have dimensions satisfying, with respect to the main body portion 51 and through-hole 31c, "length A1 inner diameter B1," as illustrated in FIG. 21A. In addition, the contact part 30 and external connection terminal 50 are configured to have dimensions satisfying, with respect to the main body portion 51 and upper protrusion 31d, "length A1≥inner diameter B1>inner diameter B2≥length A7," as illustrated in FIG. 21B. In the case of "length A1≥inner diameter B1," the inner circumference of the contact part 30 is partly recessed, which enables the external connection terminal 50 to be press-fitted in the contact part 30.

The contact part 30 and external connection terminal 50 have the above fitting dimensions. Therefore, as in the first embodiment, a fixed indentation load for inserting the external connection terminal 50 into the contact part 30 is ensured. Therefore, by pressing a plurality of external connection terminals 50 into a plurality of contact parts 30 with the fixed indentation load, it is possible to reliably insert the plurality of external connection terminals 50 into the plurality of contact parts 30 and to make the heights of the plurality of external connection terminals 50 equal to each other. Thus, it is possible to reliably and securely attach a printed circuit board to the plurality of external connection terminals 50 of the semiconductor device 1 and to reduce the occurrence of damage in the semiconductor device 1.

Further, as in the first embodiment, a fixed extraction load of extracting the external connection terminal 50 from the contact part 30 is ensured. Therefore, without a force exceeding the extraction load, it is not possible to extract the external connection terminal 50.

According to the disclosed techniques, a semiconductor device is provided, which ensures a fixed indentation load and allows external connection terminals to be inserted into contact parts properly.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a circuit pattern;
   a contact part having a cylindrical through-hole formed therein, and having first and second opening ends opposite to each other, the second opening end being joined to the circuit pattern; and
   an external connection terminal having
      a prismatic main body portion, and
      first and second end portions, the second end portion being inserted into the through-hole from the first opening end of the contact part, wherein
   the main body portion of the external connection terminal has an insertion prevented portion formed thereon,
   the contact part includes an insertion preventing portion formed on an inner circumferential surface of the through-hole, the insertion preventing portion being so positioned as to be substantially downstream, with respect to an insertion direction, from the main body portion of the external connection terminal inserted into the through-hole, the insertion direction being a direction from the first end portion to the second end portion of the external connection terminal, and
   the insertion preventing portion is abutted by the insertion prevented portion of the external connection terminal, substantially without deformation of the insertion preventing portion.

2. The semiconductor device according to claim 1, wherein the insertion prevented portion is a tapered surface formed at the second end portion of the external connection terminal, the tapered surface being a side surface of the external connection terminal of which a diameter decreases toward the circuit pattern.

3. The semiconductor device according to claim 2, wherein the insertion preventing portion includes an insertion preventing surface that is inclined with respect to the insertion direction and that faces the tapered surface.

4. The semiconductor device according to claim 1, wherein
   the prismatic main body portion has a plurality of outer surfaces and a plurality of edges each between two of the outer surfaces,
   the external connection terminal further includes an extraction prevented portion formed on the outer surfaces of the main body portion,
   the contact part further includes an extraction preventing portion formed on the inner circumferential surface of the through-hole,
   the extraction prevented portion is apart and upstream from the insertion prevented portion in the insertion direction, and
   the extraction preventing portion is upstream from the extraction prevented portion of the main body portion inserted into the through-hole, with respect to the insertion direction.

5. The semiconductor device according to claim 4, wherein
   the insertion preventing portion is a first protrusion that protrudes from the inner circumferential surface of the through-hole of the contact part,
   the extraction preventing portion is a second protrusion that protrudes from the inner circumferential surface of the through-hole of the contact part, and
   an inner diameter of the insertion preventing portion is less than or equal to an inner diameter of the extraction preventing portion.

6. The semiconductor device according to claim 4, wherein
   two of the plurality of edges are opposite to each other across the main body portion in a diameter direction of the through-hole;
   the extraction prevented portion includes a plurality of thick portions that are formed apart and upstream from the second end portion in the insertion direction and on the main body portion of the external connection terminal, the plurality of thick portions protruding outward from the main body portion, two of the thick portions being opposite to each other across the main body portion in the diameter direction; and in a sectional view of the external connection terminal in perpendicular to the insertion direction, a largest distance between said two thick portions is greater than a distance between said two opposite edges in the diameter direction.

7. The semiconductor device according to claim 6, wherein in the sectional view of the external connection terminal the external connection terminal includes a recess at a center of each of the outer surfaces, and the plurality of thick portions respectively protrude outward from the plurality of edges of the main body portion.

8. The semiconductor device according to claim 6, wherein two of the outer surfaces of the main body portion are opposite to each other in the diameter direction, and in the sectional view of the external connection terminal, the thick portions are respectively provided on said two outer surfaces.

9. The semiconductor device according to claim 6, wherein in the sectional view of the external connection terminal, the thick portions respectively protrude outward from said two opposite edges.

10. The semiconductor device according to claim 6, wherein the largest distance between said two opposite thick portions is greater than or equal to an inner diameter of the through-hole of the contact part, the inner diameter of the through-hole of the contact part is greater than an inner diameter of the extraction preventing portion, and the inner diameter of the extraction preventing portion is greater than or equal to the distance between said two opposite edges of the main body portion.

11. The semiconductor device according to claim 6, wherein an inner diameter of the through-hole of the contact part is greater than the largest distance between said two opposite thick portions of the main body portion, the largest distance between said two opposite thick portions of the main body portion is greater than an inner diameter of the extraction preventing portion, and the inner diameter of the extraction preventing portion is greater than or equal to the distance between said two opposite edges of the main body portion.

12. The semiconductor device according to claim 4, wherein the extraction prevented portion includes a plurality of depressions that are formed, upstream of the second end portion in the insertion direction, in the main body portion and that are arranged in a circumferential direction on the outer surfaces of the main body portion.

13. The semiconductor device according to claim 12, wherein the extraction preventing portion is a second protrusion that protrudes from the inner circumferential surface of the through-hole of the contact part and fits the plurality of depressions.

14. The semiconductor device according to claim 13, wherein the extraction prevented portion includes an extraction prevented surface in each of the depressions, the extraction prevented surface being inclined with respect to the insertion direction.

15. The semiconductor device according to claim 14, wherein the extraction preventing portion includes an extraction preventing surface downstream from the second protrusion in the insertion direction, the extraction preventing surface being inclined with respect to the insertion direction.

16. The semiconductor device according to claim 15, wherein in a sectional view of the external connection terminal in perpendicular to the insertion direction, portions of the edges of the main body portion corresponding to the depressions are rounded.

17. The semiconductor device according to claim 16, wherein two of the plurality of edges are opposite to each other across the main body portion in a diameter direction of the through-hole; and in the sectional view of the external connection terminal, a distance in the diameter direction between said two opposite edges of the main body portion is greater than or equal to an inner diameter of the through-hole of the contact part.

18. The semiconductor device according to claim 17, wherein two of the depressions of the main body portion are opposite to each other across the main body portion in the diameter direction, the inner diameter of the through-hole of the contact part is greater than an inner diameter of the extraction preventing portion, and the inner diameter of the extraction preventing portion is greater than or equal to a largest distance between said two opposite depressions in the diameter direction.

19. The semiconductor device according to claim 17, wherein the depressions of the external connection terminal each include another insertion prevented surface that is apart and upstream from the extraction prevented surface in the insertion direction in the main body portion, the another insertion prevented surface being inclined with respect to the insertion direction.

20. The semiconductor device according to claim 19, wherein the second protrusion of the contact part includes another insertion preventing surface in the inner circumferential surface of the through-hole, the another insertion preventing surface being inclined with respect to the insertion direction and facing the another insertion prevented surface.

* * * * *